US012641826B2

(12) United States Patent
Lee et al.

(10) Patent No.: US 12,641,826 B2
(45) Date of Patent: May 26, 2026

(54) SEMICONDUCTOR DEVICE

(71) Applicant: Samsung Electronics Co., Ltd., Suwon-si (KR)

(72) Inventors: Eui Bok Lee, Suwon-si (KR); Moon Kyun Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 335 days.

(21) Appl. No.: 18/221,479

(22) Filed: Jul. 13, 2023

(65) Prior Publication Data

US 2024/0222450 A1     Jul. 4, 2024

(30) Foreign Application Priority Data

Dec. 28, 2022     (KR) ........................ 10-2022-0186956

(51) Int. Cl.
H01L 29/417         (2006.01)
H01L 23/48         (2006.01)
(Continued)

(52) U.S. Cl.
CPC ....... H10D 30/6729 (2025.01); H01L 23/481 (2013.01); H10D 30/43 (2025.01);
(Continued)

(58) Field of Classification Search
CPC ............... H10D 30/6729; H10D 30/43; H10D 30/6735; H10D 30/6757; H10D 62/121; H10D 62/151; H10D 30/014; H10D 84/834; H10D 84/853; H10D 30/62; H10D 64/254; H01L 23/481; H01L 21/76805; H01L 21/76895; H01L 23/485; H01L 23/5286; H01L 23/535; H01L 23/5226; H01L 23/5283
(Continued)

(56) References Cited

U.S. PATENT DOCUMENTS 10,586,765  B2     3/2020   Smith et al.
10,685,865  B2     6/2020   Sung et al.
(Continued)

FOREIGN PATENT DOCUMENTS

KR     1020220130352  A     9/2022
KR     1020220162334  A     12/2022

*Primary Examiner* — Tong-Ho Kim
(74) *Attorney, Agent, or Firm* — Muir Patent Law, PLLC

(57)          ABSTRACT

A semiconductor device includes a fin-shaped pattern, a field insulating film covering a sidewall of the fin-shaped pattern, a source/drain pattern disposed on an upper surface of the fin-shaped pattern, a source/drain etch stop film extending along an upper surface of the field insulating film and a sidewall of the source/drain pattern, a source/drain contact connected to the source/drain pattern, a buried conductive pattern penetrating through a substrate and connected to the source/drain contact, a portion of the buried conductive pattern being disposed within the field insulating film, and a rear wiring line connected to the buried conductive pattern. The field insulating film includes a first field filling film and a first field stop film. The first field stop film is disposed between the first field filling film and the substrate. The first field stop film includes a material having etch selectivity with respect to the first field filling film.

18 Claims, 33 Drawing Sheets

(51) Int. Cl.

| | |
|---|---|
| *H01L 29/06* | (2006.01) |
| *H01L 29/08* | (2006.01) |
| *H01L 29/423* | (2006.01) |
| *H01L 29/775* | (2006.01) |
| *H01L 29/786* | (2006.01) |
| *H10D 30/43* | (2025.01) |
| *H10D 30/67* | (2025.01) |
| *H10D 62/10* | (2025.01) |
| *H10D 62/13* | (2025.01) |

(52) U.S. Cl.
CPC ..... *H10D 30/6735* (2025.01); *H10D 30/6757* (2025.01); *H10D 62/121* (2025.01); *H10D 62/151* (2025.01)

(58) Field of Classification Search
USPC ........................................................ 257/288
See application file for complete search history.

(56) References Cited

U.S. PATENT DOCUMENTS

| | | | |
|---|---|---|---|
| 10,770,479 B2 | 9/2020 | Smith et al. | |
| 10,872,859 B2 | 12/2020 | Kim et al. | |
| 2021/0202325 A1* | 7/2021 | Lee .................... | H10D 84/0172 |
| 2021/0375861 A1* | 12/2021 | Chung ................. | H10D 84/038 |
| 2022/0028895 A1 | 1/2022 | Kim et al. | |
| 2022/0059460 A1 | 2/2022 | Do et al. | |
| 2022/0077062 A1 | 3/2022 | Dal et al. | |
| 2022/0122970 A1 | 4/2022 | Do et al. | |
| 2022/0208679 A1 | 6/2022 | Lee et al. | |
| 2022/0208757 A1 | 6/2022 | Do et al. | |
| 2023/0317596 A1* | 10/2023 | Kim .................... | H01L 23/5226 |
| | | | 257/401 |

* cited by examiner 197
195
196
191
175
145
120
130
NS1
NS2
BP1_US
BP2_US
105US
BP1
BP2
BP1_SW
BP2_SW
106
FT
105
104
100US
100
B
B
100BS
70_S2 70 71 70_S1

SEMICONDUCTOR DEVICE

CROSS-REFERENCE TO RELATED APPLICATION

This application claims priority from Korean Patent Application No. 10-2022-0186956 filed on Dec. 28, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device.

2. Description of the Related Art

As one of scaling technologies for increasing a density of a semiconductor device, a multi-gate transistor in which a multi-channel active pattern (or a silicon body) having a fin or nanowire shape is formed on a substrate and gates are formed on a surface of the multi-channel active pattern has been proposed.

Such a multi-gate transistor uses a three-dimensional channel, and it is thus easy to scale down transistors. In addition, a current control capability may be improved without increasing a gate length of the multi-gate transistor. Furthermore, a short channel effect (SCE) that a potential of a channel region is affected by a drain voltage may be effectively suppressed.

Meanwhile, as a pitch size of the semiconductor device decreases, research has been performed to decrease a capacitance and secure electrical stability between contacts in the semiconductor device.

SUMMARY

Aspects of the present disclosure provide a semiconductor device capable of improving performance and reliability of an element.

According to some aspects of the present inventive concept, a semiconductor device includes a substrate including a first surface and a second surface opposite to each other in a vertical direction that is perpendicular to the first surface, a fin-shaped pattern provided at the first surface of the substrate and extending in a first horizontal direction that is parallel to the first surface, a field insulating film disposed on the first surface of the substrate and covering a sidewall of the fin-shaped pattern, a source/drain pattern disposed on an upper surface of the fin-shaped pattern, a source/drain etch stop film extending along an upper surface of the field insulating film and a sidewall of the source/drain pattern, a source/drain contact disposed on the source/drain pattern and connected to the source/drain pattern, a buried conductive pattern penetrating through the substrate and connected to the source/drain contact, a portion of the buried conductive pattern being disposed within the field insulating film, and a rear wiring line disposed on the second surface of the substrate and connected to the buried conductive pattern. The field insulating film includes a first field filling film and a first field stop film. The upper surface of the field insulating film includes an upper surface of the first field filling film. The first field stop film is disposed between the first field filling film and the substrate. The first field stop film includes a material having etch selectivity with respect to the first field filling film.

According to some aspects of the present inventive concept, a semiconductor device includes a substrate including a first surface and a second surface opposite to each other in a vertical direction that is perpendicular to the first surface, a fin-shaped pattern provided at the first surface of the substrate and extending in a first horizontal direction that is parallel to the first surface, a gate electrode disposed on the fin-shaped pattern and extending in a third direction, a field insulating film disposed on the substrate and covering a sidewall of the fin-shaped pattern, a source/drain pattern disposed on the fin-shaped pattern, a source/drain contact disposed on the source/drain pattern and connected to the source/drain pattern, a buried conductive pattern penetrating through the substrate, a height of the buried conductive pattern in the vertical direction being greater than a thickness of the substrate, a contact connection via disposed between the source/drain contact and the buried conductive pattern, and a rear wiring line disposed on a second surface of the substrate and connected to the buried conductive pattern. The field insulating film includes a first field filling film and a first field stop film. The upper surface of the field insulating film includes an upper surface of the first field filling film. The first field stop film is disposed between the first field filling film and the substrate. The first field stop film includes a material having etch selectivity with respect to the first field filling film. The buried conductive pattern includes a bottom surface connected to the rear wiring line and an upper surface opposite to the bottom surface of the buried conductive pattern in the vertical direction. A width of the bottom surface of the buried conductive pattern in a second horizontal direction is greater than a width of the upper surface of the buried conductive pattern in the second direction. The second horizontal direction is parallel to the first surface of the substrate and different from the first horizontal direction.

According to some aspects of the present inventive concept, a semiconductor device includes a substrate including a first surface and a second surface opposite to each other in a vertical direction that is perpendicular to the first surface, a fin-shaped pattern provided at the first surface of the substrate and extending in a first horizontal direction that is parallel to the first surface, a sheet pattern disposed on the fin-shaped pattern and spaced apart from the fin-shaped pattern in the vertical direction, a gate electrode disposed on the fin-shaped pattern and extending in a second horizontal direction that is parallel to the first surface and different from the first horizontal direction, a field insulating film disposed on the substrate surrounding the fin-shaped pattern, a source/drain pattern disposed on the fin-shaped pattern and connected to the sheet pattern, a source/drain etch stop film extending along an upper surface of the field insulating film and a sidewall of the source/drain pattern, a source/drain contact disposed on the source/drain pattern and connected to the source/drain pattern, a rear wiring line disposed on a second surface of the substrate, a buried conductive pattern connected to the rear wiring line and penetrating through the substrate, and a contact connection via connecting the source/drain contact to the buried conductive pattern. The field insulating film includes a first field filling film and a field stop film. The upper surface of the field insulating film includes an upper surface of the first field filling film. The first field stop film is disposed between the first field filling film and the substrate. The field stop film includes a material having etch selectivity with respect to the first field filling film. The buried conductive pattern includes a bottom sur-face connected to the rear wiring line and an upper surface opposite to the bottom surface of the buried conductive pattern in the vertical direction. The upper surface of the buried conductive pattern is higher than the first surface of the substrate and lower than a bottom surface of the source/drain pattern relative to the second surface of the substrate.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof with reference to the attached drawings, in which:

FIGS. 6 and 7 are views for describing a semiconductor device according to some example embodiments.

DETAILED DESCRIPTION OF THE EMBODIMENTS

Figure 1:
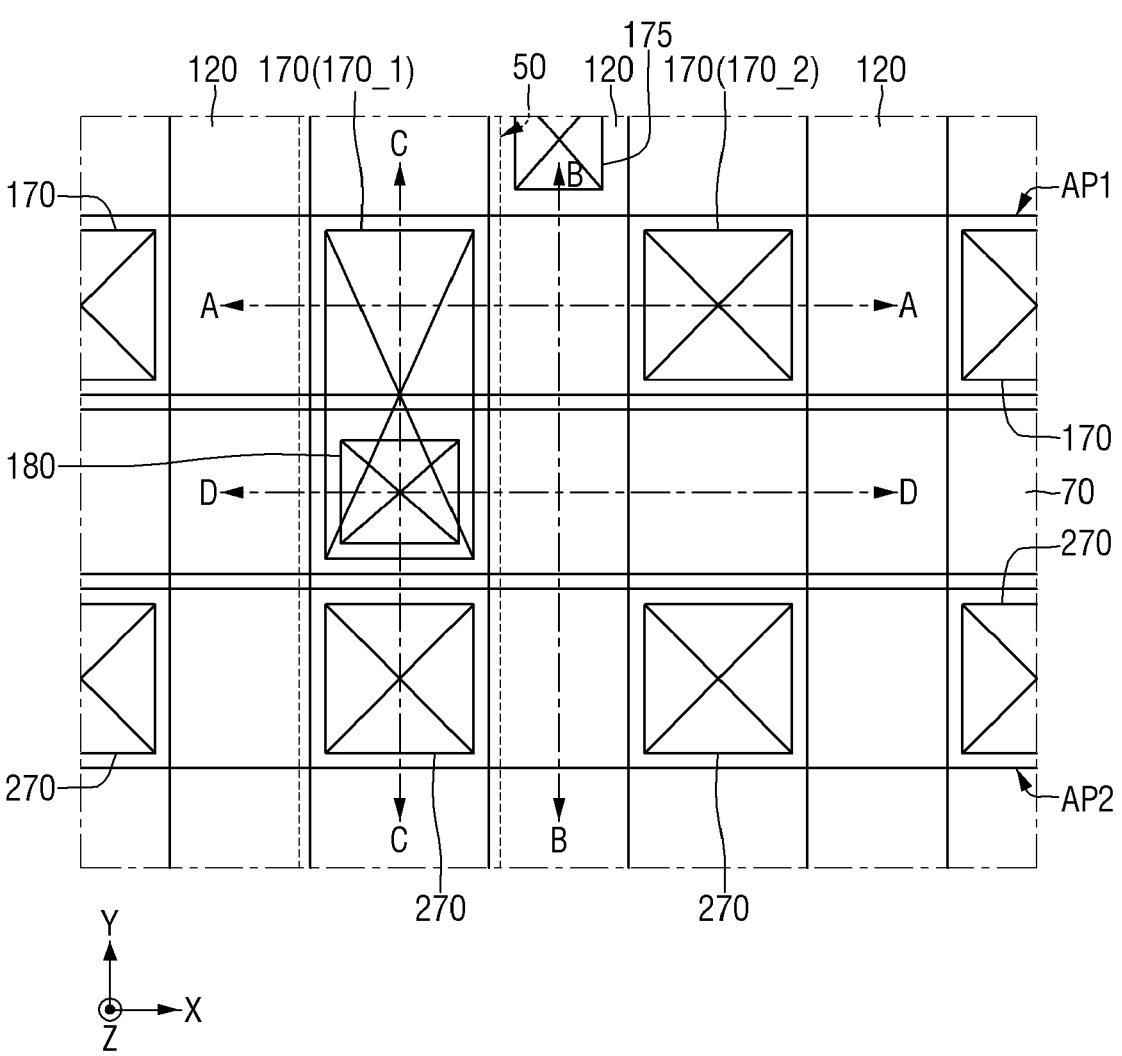
FIG. 1 is a layout diagram for describing a semiconductor device according to some example embodiments.

In the present specification, the terms "first", "second", and the like are used to describe various elements or components, but these elements or components are not limited by these terms. These terms are used only in order to distinguish one element or component from another element or component. Accordingly, a first element or component mentioned below may be a second element or component within the technical spirit of the present disclosure.

In the drawings of a semiconductor device according to some example embodiments, a fin field effect transistor (FinFET) including a channel region having a fin-shaped pattern shape, a transistor including a nanowire or a nanosheet, and a multi-bridge channel field effect transistor (MBCFET™) have been illustrated by way of example, but the present disclosure is not limited thereto.

The semiconductor device according to some example embodiments may include a tunneling field effect transistor (FET), a three-dimensional (3D) transistor, or a vertical FET. The semiconductor device according to some example embodiments may include a planar transistor. The technical spirit of the present disclosure may be applied to two-dimensional (2D) material based FETs and heterostructures thereof. The semiconductor device according to some example embodiments may include a bipolar junction tran-sistor, or a lateral double-diffused metal oxide semiconduc-tor (LDMOS) transistor.

A semiconductor device according to some example embodiments will be described with reference to FIGS. 1 to 5.

FIG. 1 is a layout diagram for describing a semiconductor device according to some example embodiments. FIGS. 2 to 5 are cross-sectional views taken along line A-A, line B-B, line C-C, and line D-D of FIG. 1, respectively.

For convenience of explanation, a wiring structure 195 is not illustrated in FIG. 1. In some embodiments, a cross-sectional view taken along a second active pattern AP2 in a first direction X (i.e., a first horizontal direction) may be similar to FIG. 2.

Referring to FIGS. 1 to 5, a semiconductor device accord-ing to some example embodiments may include a first substrate 100, a first active pattern AP1, a second active pattern AP2, a rear wiring line 50, a buried conductive pattern 70, a field insulating film 105, a plurality of gate electrodes 120, a first source/drain pattern 150, a second source/drain pattern 250, a first source/drain contact 170, a second source/drain contact 270, a contact connection via 180, and a source/drain etch stop film 185.

The first substrate 100 may include a first surface 100US and a second surface 100BS opposite to each other in a third direction Z (i.e., a vertical direction). Since the gate elec-trode 120, the first source/drain pattern 150, and the second source/drain pattern 250 may be disposed on the first surface 100US of the first substrate, the first surface 100US of the first substrate may be an upper surface of the first substrate 100. The second surface 100BS of the first substrate oppo-site to the first surface 100US of the first substrate may be a bottom surface of the first substrate 100.

The first substrate 100 may be made of a semiconductor material or may include a semiconductor material. The first substrate 100 may be a silicon substrate or a silicon-on-insulator (SOI) substrate. Alternatively, the first substrate 100 may include or may be formed of, for example, silicon germanium, silicon germanium on insulator (SGOI), indium antimonide, a lead tellurium compound, indium arsenide, indium phosphide, gallium arsenide, or gallium antimonide. The present disclosure, however, is not limited thereto.

Each of the first active pattern AP1 and the second active pattern AP2 may be disposed on the first substrate 100. For example, the first active pattern AP1 and the second active pattern AP2 may be disposed on the first surface 100US of the first substrate. Each of the first active pattern AP1 and the second active pattern AP2 may extend to be elongated in the first direction X (i.e., may extend lengthwise in the first direction X).

The first active pattern AP1 and the second active pattern AP2 may be disposed to be spaced apart from each other in a second direction Y (i.e., a second horizontal direction). The first active pattern AP1 and the second active pattern AP2 may be adjacent to each other in the second direction Y.

In some embodiments, the first active pattern AP1 may be most adjacent to the second active pattern AP2 in the second direction Y. The present disclosure, however, is not limited thereto. An additional active pattern may be disposed in a space between the first active pattern AP1 and the second active pattern AP2.

In some embodiments, one of the first active pattern AP1 and the second active pattern AP2 may be a region in which a p-type transistor is formed, and the other of the first active pattern AP1 and the second active pattern AP2 may be a region in which an n-type transistor is formed. In some embodiments, the first active pattern AP1 and the second active pattern AP2 may be regions in which p-type transistors are formed. In some embodiments, the first active pattern AP1 and the second active pattern AP2 may be regions in which n-type transistors are formed.

Each of the first active pattern AP1 and the second active pattern AP2 may be a multi-channel active pattern. For example, the first active pattern AP1 may include a first lower pattern BP1 and a plurality of first sheet patterns NS1. The second active pattern AP2 may include a second lower pattern BP2 and a plurality of second sheet patterns NS2. In the semiconductor device according to some example embodiments, each of the first active pattern AP1 and the second active pattern AP2 may be an active pattern including a nanosheet or a nanowire.

Each of the first lower pattern BP1 and the second lower pattern BP2 may protrude from the first substrate 100. For example, each of the first lower pattern BP1 and the second lower pattern BP2 may protrude from the first surface 100US of the first substrate. Each of the first lower pattern BP1 and the second lower pattern BP2 may be a fin-shaped pattern.

Each of the first lower pattern BP1 and the second lower pattern BP2 may extend to be elongated in the first direction X (i.e., extend lengthwise in the first direction X). The first lower pattern BP1 may be spaced apart from the second lower pattern BP2 in the second direction Y. The first lower pattern BP1 and the second lower pattern BP2 may be separated from each other by a fin trench FT extending in the first direction X. In the semiconductor device according to some example embodiments, the first surface 100US of the first substrate may be a bottom surface of the fin trench FT.

The first lower pattern BP1 may include a sidewall BP1_SW extending in the first direction X. The second lower pattern BP2 may include a sidewall BP2_SW extending in the first direction X. Each of the sidewall BP1_SW of the first lower pattern and the sidewall BP2_SW of the second lower pattern may be defined by the fin trench FT.

The plurality of first sheet patterns NS1 may be disposed on the first lower pattern BP1. The plurality of first sheet patterns NS1 may be spaced apart from an upper surface BP1_US of the first lower pattern in the third direction Z. The plurality of first sheet patterns NS1 may be disposed on the first surface 100US of the first substrate.

The plurality of second sheet patterns NS2 may be disposed on the second lower pattern BP2. The plurality of second sheet patterns NS2 may be spaced apart from an upper surface BP2_US of the second lower pattern in the third direction Z. The plurality of second sheet patterns NS2 may be disposed on the first surface 100US of the first substrate.

Here, the first direction X may cross the second direction Y and the third direction Z. The second direction Y may cross the third direction Z. The third direction Z may be a thickness direction of the first substrate 100. The first and second directions X and Y may be parallel to the first surface 100US of the substrate 100, and the third direction Z may be perpendicular to the first surface 100US of the substrate 100.

Each of the first sheet patterns NS1 and the second sheet patterns NS2 may include upper and bottom surfaces opposite to each other in the third direction Z. The bottom surface of the first sheet pattern NS1 and the bottom surface of the second sheet pattern NS2 may face the first substrate 100. In some embodiments, three first sheet patterns NS1 and three second sheet patterns NS2 may be disposed in the third direction Z. The present disclosure, however, is not limited thereto.

Each of the first sheet patterns NS1 and the second sheet patterns NS2 may include an uppermost sheet pattern farthest from the first substrate 100. For example, an upper surface AP1_US of the first active pattern may be an upper surface of the uppermost sheet pattern of the first sheet pattern NS1.

Each of the first lower pattern BP1 and the second lower pattern BP2 may be formed by etching a portion of the first substrate 100 or may include an epitaxial layer grown from the first substrate 100. Each of the first lower patterns BP1 and the second lower patterns BP2 may include or may be formed of silicon or germanium, which is an elemental semiconductor material. Each of the first lower patterns BP1 and the second lower patterns BP2 may include or may be formed of a compound semiconductor, for example, a group IV-IV compound semiconductor or a group III-V compound semiconductor.

The group IV-IV compound semiconductor may be, for example, a binary compound or a ternary compound including two or more of carbon (C), silicon (Si), germanium (Ge), and tin (Sn), or a compound obtained by doping carbon (C), silicon (Si), germanium (Ge), and tin (Sn) with a group IV element.

The group III-V compound semiconductor may be, for example, one of a binary compound, a ternary compound, or a quaternary compound formed by combining at least one of aluminum (Al), gallium (Ga), and indium (In), which are group III elements, with one of phosphorus (P), arsenic (As), and antimony (Sb), which are group V elements, with each other.

Each of the first sheet pattern NS1 and the second sheet pattern NS2 may include or may be formed of one of silicon or germanium, which is an elemental semiconductor material. In some embodiments, each of the first sheet patterns NS1 and the second sheet pattern NS2 may include or may be formed of a group IV-IV compound semiconductor or a group III-V compound semiconductor. Widths of the first sheet patterns NS1 in the second direction Y may increase or decrease in proportion to a width of the first lower pattern BP1 in the second direction Y. Widths of the second sheet patterns NS2 in the second direction Y may increase or decrease in proportion to a width of the second lower pattern BP2 in the second direction Y.

In some embodiments, the first sheet patterns NS1 may be disposed on the first lower pattern BP1, and may have the same width in the second direction Y. The present disclosure, however, is not limited thereto.

The field insulating film 105 may be disposed on the first substrate 100. For example, the field insulating film 105 may be disposed on the first surface 100US of the first substrate. The field insulating film 105 may fill at least a portion of the fin trench FT separating the first lower pattern BP1 and the second lower pattern BP2 from each other.

The field insulating film 105 may be disposed on the first substrate 100 between the first lower pattern BP1 and the second lower pattern BP2. In some embodiments, the field insulating film 105 may cover the entire sidewall BP1_SW of the first lower pattern and the entire sidewall BP2_SW of the second lower pattern. In some embodiments, the field insulating film 105 may cover a portion of the sidewall BP1_SW of the first lower pattern and/or a portion of the sidewall BP2_SW of the second lower pattern. For example, a portion of the first lower pattern BP1 and/or a portion of the second lower pattern BP2 may protrude from an upper surface 105US of the field insulating film in the third direction Z.

The field insulating film 105 does not cover the upper surface BP1_US of the first lower pattern and the upper surface BP2_US of the second lower pattern. Relative to the first surface 100US of the first substrate, each first sheet pattern NS1 and each second sheet pattern NS2 may be disposed at a level above the upper surface 105US of the field insulating film.

The field insulating film 105 may include a first field filling film 106 and a first field stop film 104. The first field filling film 106 and the first field stop film 104 may be disposed on the first surface 100US of the first substrate. Relative to the first surface 100US of the first substrate, the first field filling film 106 may be disposed on the first field stop film 104. The first field stop film 104 may be disposed between the first field filling film 106 and the first substrate 100. The field stop film 104 may also be disposed between the first field filling film 106 and each of the first lower pattern BP1 and the second lower pattern BP2.

For example, the first field stop film 104 may extend along a sidewall and a bottom surface of the fin trench FT. The first field stop film 104 may extend along the first surface 100US of the first substrate and the sidewall of the fin trench FT. The first field stop film 104 may include a horizontal portion extending along the first surface 100US of the first substrate and vertical portions extending along the sidewall BP1_SW of the first lower pattern and the sidewall BP2_SW of the second lower pattern. The vertical portions of the first field stop film 104 may protrude from the horizontal portion of the first field stop film 104.

At least a portion of the upper surface 105US of the field insulating film may correspond to an upper surface of the first field filling film 106. At least a portion of the upper surface 105US of the field insulating film may be defined by the first field filling film 106. In the semiconductor device according to some example embodiments, a portion of the upper surface 105US of the field insulating film may be defined by the first field filling film 106.

The first field stop film 104 may include or may be formed of a material having etch selectivity with respect to the first field filling film 106. The first field filling film 106 may include or may be formed of a silicon oxide-based insulating material. The first field filling film 106 may include or may be formed of, for example, silicon oxide. The first field stop film 104 may include or may be formed of, for example, one of silicon oxycarbide (SiCO), silicon carbonitride (SiCN), hydrogen-doped SiCN (SiCHN), hydrogen-doped SiCO (SiOCH), and aluminum oxide (AlO). The present disclosure, however, is not limited thereto. The silicon oxycarbide (SiCO) may be carbon-doped silicon oxide or oxygen-doped silicon carbide.

A plurality of gate structures GS may be disposed on the first surface 100US of the first substrate. Each gate structure GS may extend in the second direction Y. The gate structures GS may be disposed to be spaced apart from each other in the first direction X. The gate structures GS may be adjacent to each other in the first direction X.

The gate structure GS may be disposed on the first active pattern AP1 and the second active pattern AP2. The gate structure GS may cross the first active pattern AP1 and the second active pattern AP2.

The gate structure GS may cross the first lower pattern BP1 and the second lower pattern BP2. The gate structure GS may surround each of the first sheet patterns NS1. The gate structure GS may surround each of second sheet patterns NS2.

In some embodiments, the gate structure GS may be disposed across the first active pattern AP1 and the second active pattern AP2. The present disclosure, however, is not limited thereto. In some embodiments, a portion of the gate structure GS may be separated into two portions by a gate isolation structure disposed on the field insulating film 105 and disposed on the first active pattern AP1 and the second active pattern AP2.

The gate structure GS may include, for example, a gate electrode 120, a gate insulating film 130, a gate spacer 140, and a gate capping pattern 145.

The gate structure GS may include a plurality of inner gate structures I_GS disposed between the first sheet patterns NS1 adjacent to each other in the third direction Z and between the first lower pattern BP1 and the first sheet pattern NS1. The inner gate structure I_GS may be disposed between the upper surface BP1_US of the first lower pattern and the bottom surface of the first sheet pattern NS1 and between an upper surface of the first sheet pattern NS1 and a bottom surface of the first sheet pattern NS1 facing each other in the third direction Z.

The number of inner gate structures I_GS may be the same as the number of first sheet patterns NS1. The inner gate structure I_GS may contact the upper surface BP1_US of the first lower pattern, the upper surface of the first sheet pattern NS1, and the bottom surface of the first sheet pattern NS1. In the semiconductor device according to some example embodiments, the inner gate structure I_GS may be in contact with a first source/drain pattern 150 to be described later. The term "contact," or "in contact with," as used herein, refers to a direct connection (i.e., physical touching) unless the context indicates otherwise.

The inner gate structure I_GS may include gate electrodes 120 and gate insulating films 130 disposed between the first sheet patterns NS1 adjacent to each other and between the first lower pattern BP1 and the first sheet pattern NS1. In some embodiments, the inner gate structure I_GS may be disposed between the second sheet patterns NS2 adjacent to each other in the third direction Z and between the second lower pattern BP2 and the second sheet pattern NS2.

The gate electrode 120 may be disposed on the first lower pattern BP1 and the second lower pattern BP2. The gate electrode 120 may cross the first lower pattern BP1 and the second lower pattern BP2. The gate electrode 120 may surround the first sheet pattern NS1 and the second sheet pattern NS2.

Figure 2:
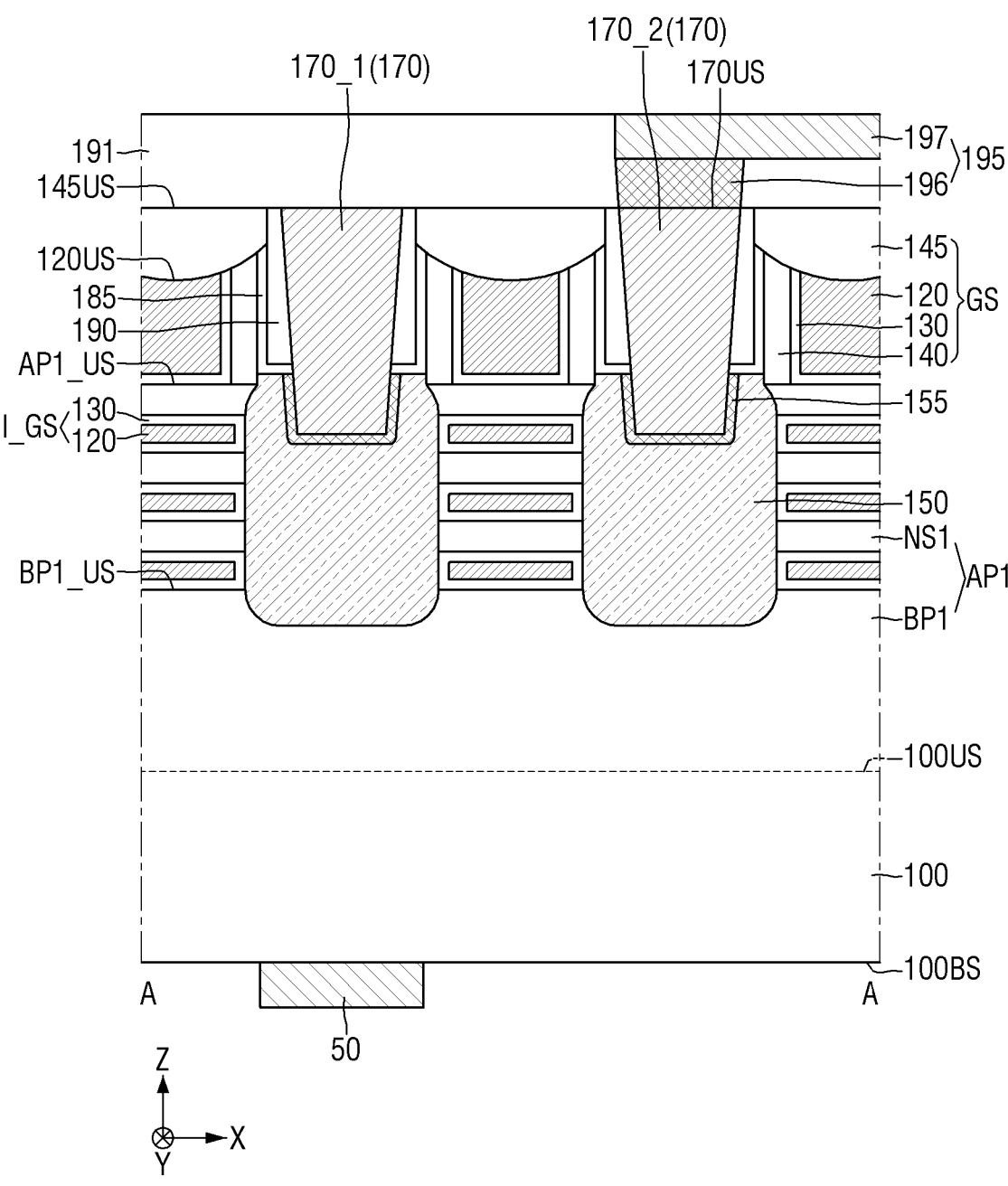
FIGS. 2 to 5 are cross-sectional views taken along line A-A, line B-B, line C-C, and line D-D of FIG. 1, respectively.

In the cross-sectional view as illustrated in FIG. 2, an upper surface 120US of the gate electrode may be a concave curved surface. The present disclosure, however, is not limited thereto. The upper surface 120US of the gate electrode may be a flat surface.

The gate electrode 120 may include or may be formed of at least one of a metal, a metal alloy, conductive metal nitride, metal silicide, a doped semiconductor material, conductive metal oxide, and conductive metal oxynitride. The gate electrode 120 may include or may be formed of, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC-N), titanium aluminum carbide (TiAlC), titanium carbide (TIC), tantalum carbonitride (TaCN), tungsten (W), aluminum (Al), copper (Cu), cobalt (Co), titanium (Ti), tantalum (Ta), nickel (Ni), platinum (Pt)), nickel platinum (NiPt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof. The present disclosure, however, is not limited thereto. The conductive metal oxide and the conductive metal oxynitride may include oxidized forms of the above-described materials. The present disclosure, however, is not limited thereto.

The gate insulating film 130 may extend along the upper surface 105US of the field insulating film, the upper surface BP1_US of the first lower pattern, and the upper surface BP2_US of the second lower pattern. The gate insulating film 130 may surround the plurality of first sheet patterns NS1. The gate insulating film 130 may surround the plurality of second sheet patterns NS2. The gate insulating film 130 may be disposed along circumferences of the first sheet pattern NS1 and circumferences of the second sheet pattern NS2. The gate electrode 120 may be disposed on the gate insulating film 130.

The gate insulating film 130 may be disposed between the gate electrode 120 and the first sheet pattern NS1 and between the gate electrode 120 and the second sheet pattern NS2. In the semiconductor device according to some example embodiments, the gate insulating film 130 included in the inner gate structure I_GS may be in contact with a first source/drain pattern 150 to be described later.

The gate insulating film 130 may include or may be formed of silicon oxide, silicon oxynitride, silicon nitride, or a high-k material having a dielectric constant greater than that of the silicon oxide. The high-k material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

In some embodiments, the gate insulating film 130 may be a single film. The present disclosure, however, is not limited thereto. The gate insulating film 130 may include a plurality of films. The gate insulating film 130 may include an interfacial layer disposed between the first active pattern AP1 and the gate electrode 120 and between the second active pattern AP2 and the gate electrode 120 and a high-k insulating film. For example, the interfacial layer may not be formed along a profile of the upper surface 105US of the field insulating film.

The semiconductor device according to some example embodiments may include a negative capacitance (NC) FET using a negative capacitor. For example, the gate insulating film 130 may include or may be formed of a ferroelectric material film having ferroelectric characteristics and a paraelectric material film having paraelectric characteristics.

The ferroelectric material film may have a negative capacitance, and the paraelectric material film may have a positive capacitance. For example, when two or more capacitors are connected with each other in series and a capacitance of each capacitor has a positive value, a total capacitance decreases as compared with a capacitance of each individual capacitor. On the other hand, when at least one of capacitances of two or more capacitors that are connected with each other in series has a negative value, a total capacitance may have a positive value and be greater than an absolute value of each individual capacitance.

When the ferroelectric material film having the negative capacitance and the paraelectric material film having the positive capacitance are connected with each other in series, a total capacitance value of the ferroelectric material film and the paraelectric material film that are connected with each other in series may increase. A transistor including the ferroelectric material film may have a subthreshold swing (SS) less than 60 mV/decade at room temperature using the increase in the total capacitance value.

The ferroelectric material film may have the ferroelectric characteristics. The ferroelectric material film may include or may be formed of, for example, at least one of hafnium oxide, hafnium zirconium oxide, barium strontium titanium oxide, barium titanium oxide, and lead zirconium titanium oxide. In some embodiments, the hafnium zirconium oxide may be a material obtained by doping hafnium oxide with zirconium (Zr). In some embodiments, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A type of dopant included in the ferroelectric material film may change depending on a type of ferroelectric material included in the ferroelectric material film.

When the ferroelectric material film includes or is formed of the hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 atomic % (at %) of aluminum. Here, at % of the dopant (e.g., aluminum) may signify a ratio of a number of atoms of aluminum to the sum of a number of atoms of hafnium and the number of atoms of aluminum.

When the dopant is silicon (Si), the ferroelectric material film may include 2 to 10 at % of silicon. When the dopant is yttrium (Y), the ferroelectric material film may include 2 to 10 at % of yttrium. When the dopant is gadolinium (Gd), the ferroelectric material film may include 1 to 7 at % of gadolinium. When the dopant is zirconium (Zr), the ferroelectric material film may include 50 to 80 at % of zirconium.

The paraelectric material film may have the paraelectric characteristics. The paraelectric material film may include or may be formed of, for example, at least one of silicon oxide and a metal oxide having a high dielectric constant. The metal oxide included in the paraelectric material film may include or may be, for example, at least one of hafnium oxide, zirconium oxide, and aluminum oxide. The present disclosure, however, is not limited thereto.

The ferroelectric material film and the paraelectric material film may include or may be formed of the same material. The ferroelectric material film may have the ferroelectric characteristics, but the paraelectric material film may not have the ferroelectric characteristics. For example, when the ferroelectric material film and the paraelectric material film include or is formed of hafnium oxide, a crystal structure of the hafnium oxide included in the ferroelectric material film is different from a crystal structure of the hafnium oxide included in the paraelectric material film.

The ferroelectric material film may have a thickness having the ferroelectric characteristics. The thickness of the ferroelectric material film may be, for example, 0.5 to 10 nm. The present disclosure, however, is not limited thereto. Since a critical thickness representing the ferroelectric characteristics may change for each ferroelectric material, the thickness of the ferroelectric material film may change depending on a ferroelectric material.

In some embodiments, the gate insulating film 130 may include or is formed of one ferroelectric material film. In some embodiments, the gate insulating film 130 may include a plurality of ferroelectric material films spaced apart from each other. The gate insulating film 130 may have a stacked film structure in which a plurality of ferroelectric material films and a plurality of paraelectric material films are alternately stacked.

The gate spacer 140 may be disposed on a sidewall of the gate electrode 120. The gate spacer 140 may not be disposed between the first lower pattern BP1 and the first sheet pattern NS1 and between the first sheet patterns NS1 adjacent to each other in the third direction Z.

The gate spacer 140 may include or may be formed of, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), and a combination thereof. In some embodiments, the gate spacer 140 may be a single film. The present disclosure, however, is not limited thereto.

The gate capping pattern 145 may be disposed on the gate electrode 120 and the gate spacers 140. For example, the gate capping pattern 145 may be disposed on an upper surface of the gate electrode 120 and upper surfaces of the gate spacers. An upper surface 145US of the gate capping pattern may be coplanar with an upper surface of a first interlayer insulating film 190. The present disclosure, however, is not limited thereto. In some embodiments, the gate capping pattern 145 may be disposed in a space between the gate spacers 140. The upper surface 145US of the gate capping pattern may be coplanar with the upper surface of the first interlayer insulating film 190 and the upper surfaces of the gate spacers 140.

The gate capping pattern 145 may include or may be formed of, for example, at least one of silicon nitride, silicon oxynitride, silicon carbonitride, silicon oxycarbonitride, and a combination thereof. The gate capping pattern 145 may include or may be formed of a material having etch selectivity with respect to the first interlayer insulating film 190.

The first source/drain pattern 150 may be disposed on the first active pattern AP1. The first source/drain pattern 150 may be disposed on the first lower pattern BP1.

The first source/drain pattern 150 may be disposed between the gate electrodes 120 adjacent to each other in the first direction X. The first source/drain pattern 150 may be in contact with the first active pattern AP1. The first source/drain pattern 150 may be in contact with the first sheet pattern NS1. The first source/drain pattern 150 may be connected to the first sheet pattern NS1 on the first surface 100US of the first substrate.

The first source/drain pattern 150 may include a bottom surface 150BS facing the first lower pattern BP1 and a sidewall 150SW extending from the bottom surface 150BS of the first source/drain pattern in the third direction Z. The sidewall 150SW of the first source/drain pattern may include a facet intersection point where inclined surfaces meet each other. The present disclosure, however, is not limited thereto.

The second source/drain pattern 250 may be disposed on the second active pattern AP2. The second source/drain pattern 250 may be disposed on the second lower pattern BP2.

The second source/drain pattern 250 may be disposed between the gate electrodes 120 adjacent to each other in the first direction X. The second source/drain pattern 250 may be in contact with the second active pattern AP2. In some embodiments, the second source/drain pattern 250 may be in contact with the second sheet pattern NS2. The second source/drain pattern 250 may be connected to the second sheet pattern NS2 on the first surface 100US of the first substrate.

The second source/drain pattern 250 may include a bottom surface 250BS facing the second lower pattern BP2 and a sidewall 250SW extending from the bottom surface 250BS of the second source/drain pattern in the third direction Z. The sidewall 250SW of the second source/drain pattern may include a facet intersection point where inclined surfaces meet each other. The present disclosure, however, is not limited thereto.

The first source/drain pattern 150 may be included in a source/drain of a transistor using the first sheet pattern NS1 as a channel region. The second source/drain pattern 250 may be included in a source/drain of a transistor using the second sheet pattern NS2 as a channel region.

The first source/drain pattern 150 and the second source/drain pattern 250 may include epitaxial patterns. Each of the first source/drain pattern 150 and the second source/drain pattern 250 may include or may be formed of a semiconductor material.

In some embodiments, the first source/drain pattern 150 and the second source/drain pattern 250 may include or may be doped with a p-type dopant. The p-type dopant may include at least one of boron (B) and gallium (Ga). The present disclosure, however, is not limited thereto. In some embodiments, the first source/drain pattern 150 and the second source/drain pattern 250 may include or may be doped with an n-type dopant. The n-type dopant may include at least one of phosphorus (P), arsenic (As), antimony (Sb), and bismuth (Bi). The present disclosure, however, is not limited thereto. In some embodiments, one of the first source/drain pattern 150 and the second source/drain pattern 250 may include or may be doped with a p-type dopant, and the other of the first source/drain pattern 150 and the second source/drain pattern 250 may include or may be doped with an n-type dopant.

The source/drain etch stop film 185 may extend along an outer sidewall of the gate spacer 140, the sidewall 150SW of the first source/drain pattern, and the sidewall 250SW of the second source/drain pattern. The source/drain etch stop film 185 may extend along the upper surface 105US of the field insulating film.

The source/drain etch stop film 185 may not extend along a sidewall of the gate capping pattern 145. In some embodiments, the source/drain etch stop film 185 may extend along the sidewall of the gate capping pattern 145.

The source/drain etch stop film 185 may include or may be formed of a material having etch selectivity with respect to a first interlayer insulating film 190 to be described later. The source/drain etch stop film 185 may include or may be formed of, for example, at least one of silicon nitride, silicon oxynitride, silicon oxycarbonitride, silicon boron nitride, silicon oxyboron nitride, silicon oxycarbide, and a combination thereof.

The first interlayer insulating film 190 may be disposed on the first surface 100US of the first substrate. The first interlayer insulating film 190 may be disposed on the first source/drain pattern 150 and the second source/drain pattern 250. The first interlayer insulating film 190 may not cover the upper surface of the gate capping pattern 145. For example, the upper surface of the first interlayer insulating film 190 may be coplanar with the upper surface 145US of the gate capping pattern. The present disclosure, however, is not limited thereto.

The first interlayer insulating film 190 may include or may be formed of, for example, at least one of silicon oxide, silicon nitride, silicon oxynitride, and a low-k dielectric material. A dielectric constant of the low-k dielectric material may have a value smaller than 3.9, which is a dielectric constant of silicon oxide.

The first source/drain contact 170 may extend in the third direction Z on the first surface 100US of the first substrate. The first source/drain contact 170 may be disposed on the first source/drain pattern 150. The first source/drain contact 170 may be electrically connected to the first source/drain pattern 150.

The first source/drain contact 170 may include a first rear connection contact 170_1 and a first front connection contact 170_2. The first rear connection contact 170_1 may be connected to the buried conductive pattern 70 through the contact connection via 180. The first front connection contact 170_2 may not contact the contact connection via 180 and may not be connected to the contact connection via 180.

The second source/drain contact 270 may extend in the third direction Z on the first surface 100US of the first substrate. The second source/drain contact 270 may be disposed on the second source/drain pattern 250. The second source/drain contact 270 may be electrically connected to the second source/drain pattern 250.

In some embodiments, the second source/drain contact 270 may include a second rear connection contact and a second front connection contact.

A height from the upper surface AP1_US of the first active pattern to an upper surface 170US of the first source/drain contact may be the same as a height from the upper surface AP1_US of the first active pattern to the upper surface 145US of the gate capping pattern. The upper surface 170US of the first source/drain contact may be coplanar with an upper surface 270US of the second source/drain contact.

A gate contact 175 may be disposed on the gate electrode 120. The gate contact 175 may be connected to the gate electrode 120. The gate contact 175 may penetrate through the gate capping pattern 145.

A first contact silicide film 155 may be disposed between the first source/drain contact 170 and the first source/drain pattern 150. A second contact silicide film 255 may be disposed between the second source/drain contact 270 and the second source/drain pattern 250.

In some embodiments, each of the first source/drain contact 170 and the second source/drain contact 270 may have a single conductive film structure. The present disclosure, however, is not limited thereto. In some embodiments, each of the first source/drain contact 170 and the second source/drain contact 270 may have a multi-conductive film structure including a contact barrier film and a contact plug film.

The first source/drain contact 170 and the second source/drain contact 270 may include or may be formed of, for example, at least one of a metal, a metal alloy, conductive metal nitride, conductive metal carbide, conductive metal oxide, conductive metal carbonitride, and a two-dimensional (2D) material.

The first contact silicide film 155 and the second contact silicide film 255 may include or may be formed of a metal silicide material.

The buried conductive pattern 70 may be disposed between the first active pattern AP1 and the second active pattern AP2. The buried conductive pattern 70 may overlap the field insulating film 105 disposed between the first lower pattern BP1 and the second lower pattern BP2 in the third direction Z.

The buried conductive pattern 70 may extend to be elongated in the first direction X (i.e., may extend lengthwise in the first direction X). When viewed in a plan view, the buried conductive pattern 70 may cross the gate electrode 120. A portion of the buried conductive pattern 70 may overlap the gate electrode 120 in the third direction Z. In the semiconductor device according to some example embodiments, the buried conductive pattern 70 may be formed in a line shape.

The buried conductive pattern 70 may be connected to the first rear connection contact 170_1 through the contact connection via 180. The buried conductive pattern 70 may be connected to the rear wiring line 50.

The buried conductive pattern 70 may penetrate through the first substrate 100. The buried conductive pattern 70 may protrude from the first surface 100US of the first substrate in the third direction Z. A portion of the buried conductive pattern 70 may be disposed within the field insulating film 105. For example, the buried conductive pattern 70 may extend from the second surface 100BS of the substrate toward the upper surface 105US of the field insulating film. The first surface 70_S1 of the buried conductive pattern 70 may be lower than the upper surface 105US of the field insulating film.

The field insulating film 105 may cover a portion of a sidewall of the buried conductive pattern 70. The buried conductive pattern 70 may be disposed between the sidewall BP1_SW of the first lower pattern and the sidewall BP2_SW of the second lower pattern facing each other. A portion of the buried conductive pattern 70 may overlap the first lower pattern BP1 and the second lower pattern BP2 in the second direction Y.

The buried conductive pattern 70 may include a first surface 70_S1 and a second surface 70_S2 opposite to each other in the third direction Z. The first surface 70_S1 of the buried conductive pattern may be an upper surface of the buried conductive pattern 70. The second surface 70_S2 of the buried conductive pattern may be a bottom surface of the buried conductive pattern 70. The second surface 70_S2 of the buried conductive pattern may be connected to the rear wiring line 50.

A width of the buried conductive pattern 70 in the second direction Y may decrease as a distance from the second surface 100BS of the first substrate increases. A width W12 of the second surface 70_S2 of the buried conductive pattern in the second direction Y may be greater than a width W11 of the first surface 70_S1 of the buried conductive pattern in the second direction Y.

For example, a height H11 from the second surface 100BS of the first substrate to the first surface 70_S1 of the buried conductive pattern may be greater than a height H13 from the second surface 100BS of the first substrate to the first surface 100US of the first substrate. The height H11 from the second surface 100BS of the first substrate to the first surface 70_S1 of the buried conductive pattern may be a height of the buried conductive pattern 70 in the third direction Z. The height H13 from the second surface 100BS of the first substrate to the first surface 100US of the first substrate may be a thickness of the first substrate 100. Alternatively, the height H13 from the second surface 100BS of the first substrate to the first surface 100US of the first substrate may be a height from the second surface 100BS of the first substrate to the lowermost portion of the field insulating film 105.

The height H11 from the second surface 100BS of the first substrate to the first surface 70_S1 of the buried conductive pattern may be smaller than or equal to a height H12 from the second surface 100BS of the first substrate to the bottom surface 150BS of the first source/drain pattern.

Relative to the second surface 100BS of the first substrate, the first surface 70_S1 of the buried conductive pattern may be higher than the first surface 100US of the first substrate. Relative to the second surface 100BS of the first substrate, the first surface 70_S1 of the buried conductive pattern may be lower than or equal to the bottom surface 150BS of the first source/drain pattern.

In FIGS. 2 to 5, relative to the second surface 100BS of the first substrate, the upper surface BP1_US of the first lower pattern may be higher than the bottom surface 150BS of the first source/drain pattern. The upper surface 105US of the field insulating film at a portion that overlaps the gate structure GS may be higher than the upper surface 105US of the field insulating film at a portion that does not overlap with the gate structure. The height H11 from the second surface 100BS of the first substrate to the first surface 70_S1 of the buried conductive pattern may be smaller than a height from the second surface 100BS of the first substrate to the upper surface BP1_US of the first lower pattern. For example, in FIG. 3, the field insulating film 105 may be disposed between the first surface 70_S1 of the buried conductive pattern and a bottom surface of the gate insulating film 130. The bottom surface of the gate insulating film 130 faces the upper surface 105US of the field insulating film.

When the first surface 70_S1 of the buried conductive pattern is higher than the bottom surface 150BS of the first source/drain pattern relative to the second surface 100BS of the first substrate, the buried conductive pattern 70 may also be connected to the second source/drain pattern 250. Accordingly, an electrical short-circuit may occur between the buried conductive pattern 70 and the second source/drain pattern 250. The buried conductive pattern 70 may be connected to the gate insulating film 130 and/or the gate electrode 120. Accordingly, an electrical short-circuit may occur between the buried conductive pattern 70 and the gate electrode 120. A buried insulating liner 71 may extend along a sidewall of the buried conductive pattern 70. The buried insulating liner 71 may be disposed between the buried conductive pattern 70 and the first substrate 100. In some embodiments, the buried insulating liner 71 may not be formed in a space between the buried conductive pattern 70 and the first substrate 100.

In some embodiments, the buried conductive pattern 70 may have a single conductive film structure. The present disclosure, however, is not limited thereto. In some embodiments, the buried conductive pattern 70 may have a multi-conductive film structure including a buried conductive barrier film and a buried conductive plug film.

The buried conductive pattern 70 may include or may be formed of, for example, at least one of a metal, a metal alloy, conductive metal nitride, conductive metal carbide, conductive metal oxide, conductive metal carbonitride, and a 2D material. The buried insulating liner 71 may be made of an insulating material.

Figure 3:
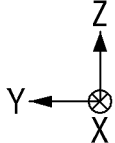
Figure 4:
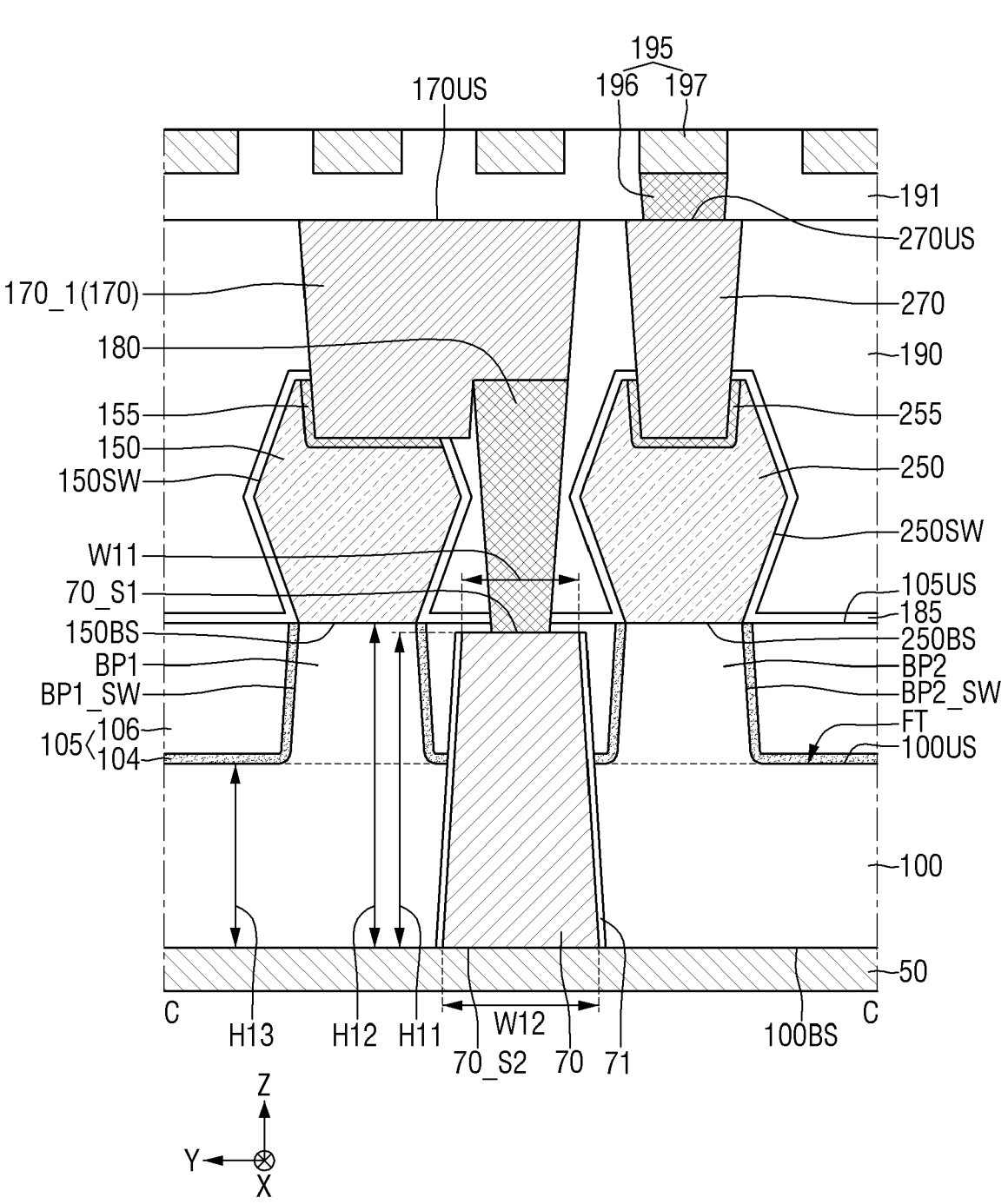
Figure 5:
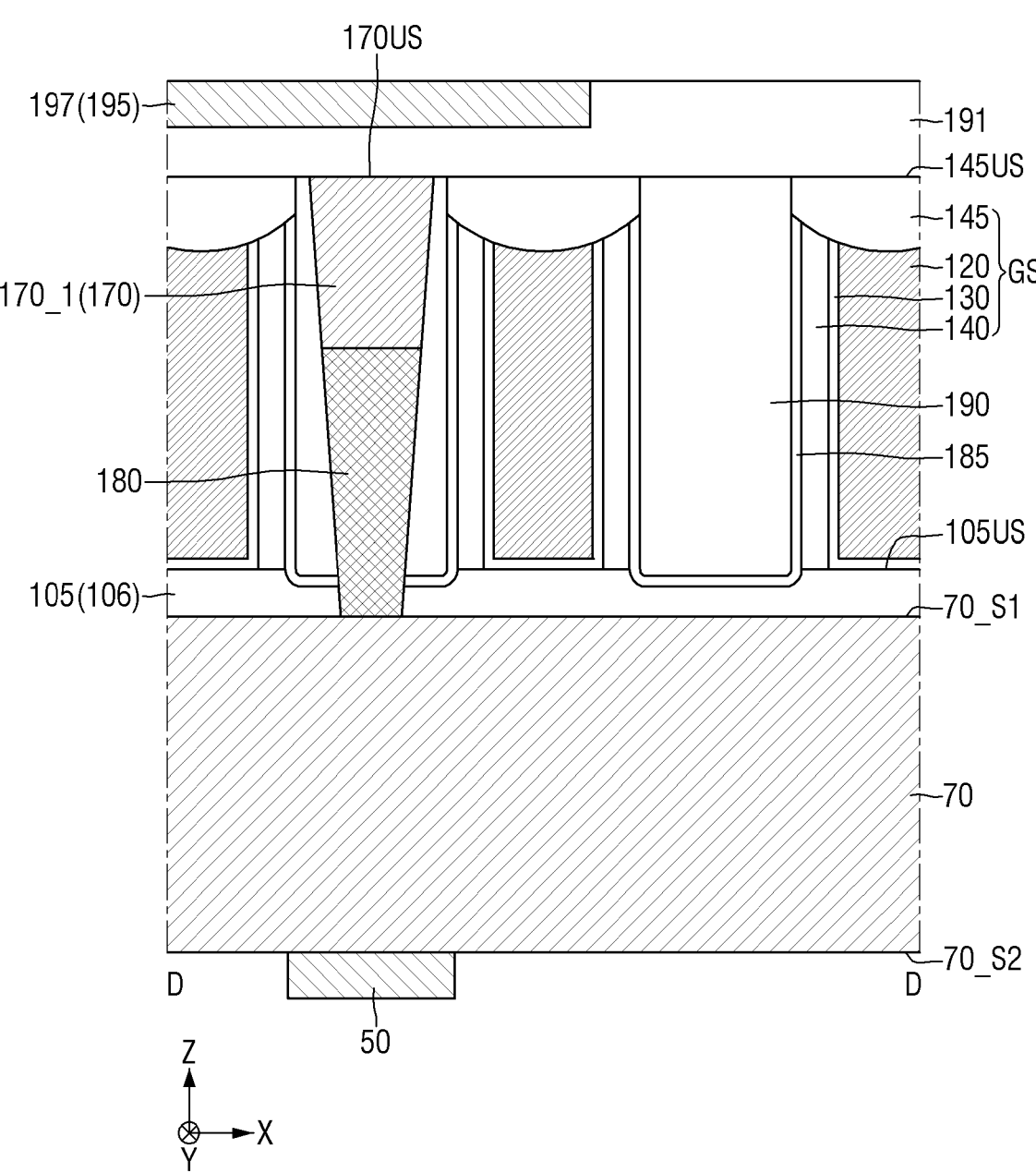

The buried conductive pattern 70 of FIGS. 3 to 5 may be formed after the first source/drain contact 170 and the second source/drain contact 270 are formed.

The contact connection via 180 may be disposed between the first source/drain contact 170 and the buried conductive pattern 70. For example, the contact connection via 180 connects the first rear connection contact 170_1 and the buried conductive pattern 70 to each other.

Relative to the second surface 100BS of the first substrate, a bottom surface of the contact connection via 180 in contact with the first surface 70_S1 of the buried conductive pattern may be lower than the upper surface 105US of the field insulating film at a portion overlapping the gate structure GS. For example, the contact connection via 180 may penetrate through the source/drain etch stop film 185 and be connected to the buried conductive pattern 70.

The first rear connection contact 170_1 may be in contact with at least a portion of an upper surface of the contact connection via 180. A height from the first surface 70_S1 of the buried conductive pattern to the upper surface of the contact connection via 180 may be smaller than a height from the first surface 70_S1 of the buried conductive pattern to the upper surface 170US of the first source/drain contact.

In some embodiments, the first rear connection contact 170_1 may not cover the upper surface of the contact connection via 180. The first rear connection contact 170_1 may contact a sidewall of the contact connection via 180 extending in the third direction Z. A height from the first surface 70_S1 of the buried conductive pattern to the upper surface of the contact connection via 180 may the same as a height from the first surface 70_S1 of the buried conductive pattern to the upper surface 170US of the first source/drain contact.

Relative to the second surface 100BS of the first substrate, the first surface 70_S1 of the buried conductive pattern may be higher than the first surface 100US of the first substrate to reduce a height of the contact connection via 180 in the third direction Z. Since current flows in the third direction Z between the first source/drain contact 170 and the rear wiring line 50 via the contact connection via 180, the shorter height of the contact connection via 180, the lower resistance of the contact connection via 180 may be. With the contact connection via 180, resistance between the first source/drain contact 170 and the buried conductive pattern 70 may decrease, thereby improving performance of the semiconductor device.

In some embodiments, the contact connection via 180 may have a single conductive film structure. The present disclosure, however, is not limited thereto. In some embodiments, the contact connection via 180 may have a multi-conductive film structure including a via barrier film and a via plug film.

The contact connection via 180 may include or may be formed of, for example, at least one of a metal, a metal alloy, conductive metal nitride, conductive metal carbide, conductive metal oxide, conductive metal carbonitride, and a 2D material.

In some embodiments, the buried conductive pattern 70 may be formed after the first source/drain contact 170 and the second source/drain contact 270 are formed. During a time when the first substrate 100 is etched to form the buried conductive pattern 70, the first field stop film 104 may indicate that an exposure point of the contact connection via 180 has been reached. Accordingly, a stable connection between the buried conductive pattern 70 and the contact connection via 180 may be achieved. During a time when a trench is formed in the first substrate 100 in order to form the buried conductive patterns 70, the first field stop film 104 extending along the sidewall of the fin trench FT may serve as a guide. During a time when the first substrate 100 is etched, the first field stop film 104 may prevent the source/drain patterns 150 and 250 from being directly exposed.

During a time when a via hole is formed in order to form the contact connection via 180 in the first interlayer insulating film 190, the first field stop film 104 may indicate that an exposure point of the first substrate 100 has been reached. Accordingly, an increase in the height of the contact connection via 180 may be prevented.

The rear wiring line 50 may be disposed on the second surface 100BS of the first substrate. For example, the rear wiring line 50 may extend in the second direction Y. The present disclosure, however, is not limited thereto.

The rear wiring line 50 may be connected to the buried conductive pattern 70. The rear wiring line 50 may be connected to the first rear connection contact 170_1 through the buried conductive pattern 70. The first rear connection contact 170_1 connects the rear wiring line 50 and the first source/drain pattern 150 to each other. The first front connection contact 170_2 may not be connected to the rear wiring line 50.

In some embodiments, the rear wiring line 50 may be a power line for supplying power to the semiconductor device. In some embodiments, the rear wiring line 50 may be a signal line supplying an operation signal of the semiconductor device.

In some embodiments, the rear wiring line 50 may have a single conductive film structure. The present disclosure, however, is not limited thereto. In some embodiments, the rear wiring line 50 may have a multi-conductive film structure including a rear wiring barrier film and a rear wiring plug film.

The rear wiring line 50 may include or may be formed of, for example, at least one of a metal, a metal alloy, conductive metal nitride, conductive metal carbide, conductive metal oxide, conductive metal carbonitride, and a 2D material.

In some embodiments, a rear wiring plug may be further disposed between the rear wiring line 50 and the buried conductive pattern 70. The rear wiring plug may have a contact shape other than a line shape like a front via plug 196 to be described later.

A second interlayer insulating film 191 may be disposed on the first interlayer insulating film 190, the gate structure GS, the first source/drain contact 170 and the second source/drain contact 270. The second interlayer insulating film 191 may include or may be formed of, for example, at least one of silicon oxide, silicon nitride, silicon carbonitride, silicon oxynitride, and a low-k dielectric material.

A front wiring structure 195 may be disposed within the second interlayer insulating film 191. The front wiring structure 195 may be disposed on the first surface 100US of the first substrate. The front wiring structure 195 may include a front via plug 196 and a front wiring line 197.

The front wiring structure 195 may be connected to the first source/drain contact 170, the second source/drain contact 270 and the gate contact 175. For example, the front wiring structure 195 may be connected to the first front connection contact 170_2. The first front connection contact 170_2 may connect the front wiring structure 195 and the first source/drain pattern 150 to each other. In the semiconductor device according to some example embodiments, the front wiring structure 195 may not be connected to the first rear connection contact 170_1.

Each of the front via plug 196 and the front wiring line 197 may include or may be formed of, for example, at least one of a metal, a metal alloy, conductive metal nitride, conductive metal carbide, conductive metal oxide, conductive metal carbonitride, and a 2D material.

In some embodiments, each of the front via plug 196 and the front wiring line 197 may include or may be formed of a single conductive film structure. The present disclosure, however, is not limited thereto. In some embodiments, at least one of the front via plug 196 and the front wiring line 197 may have a multi-conductive film structure. In some embodiments, the front wiring structure 195 may have an integral structure in which there is no boundary surface between the front via plug 196 and the front wiring line 197.

Figure 6:
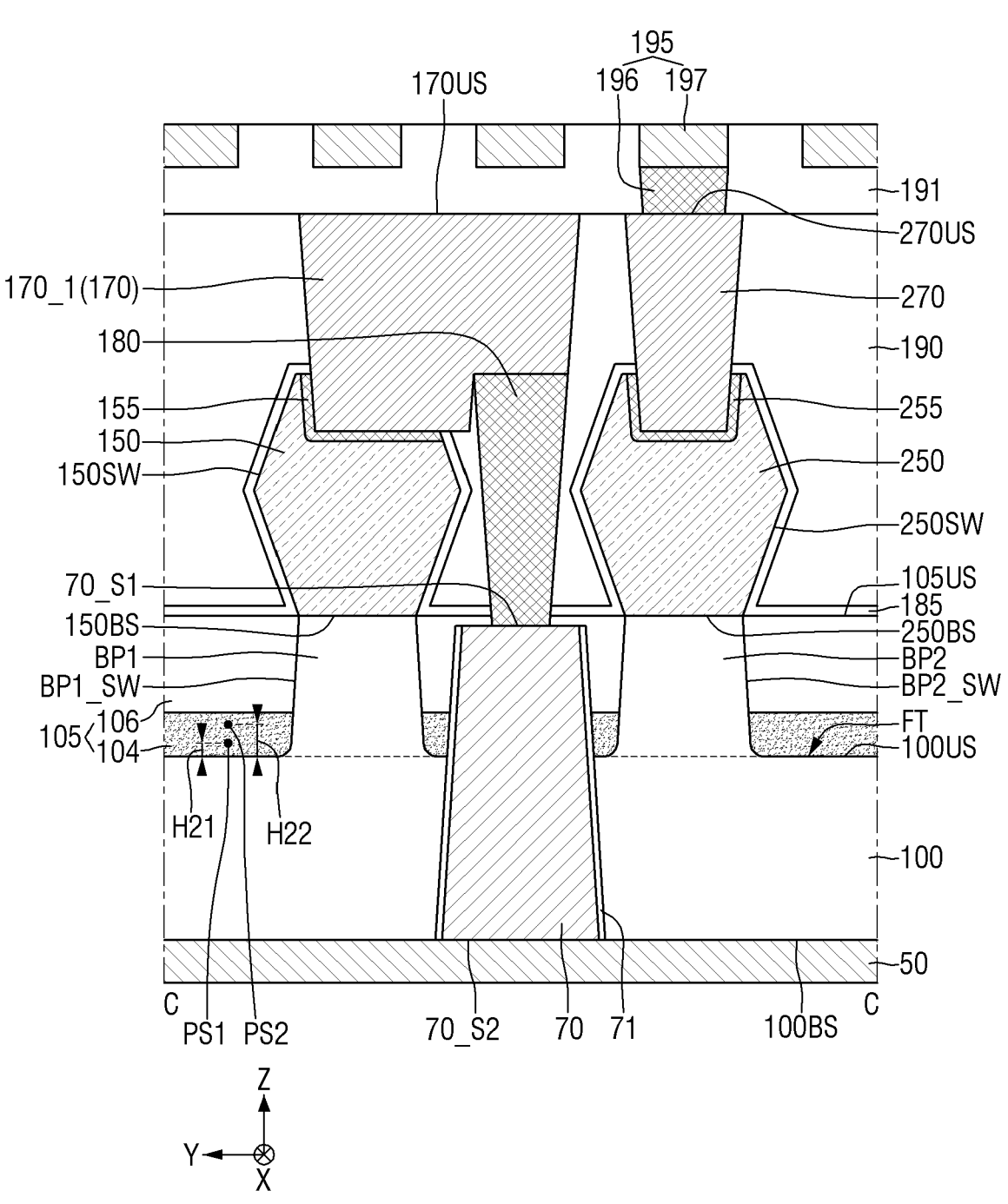
Figure 7:
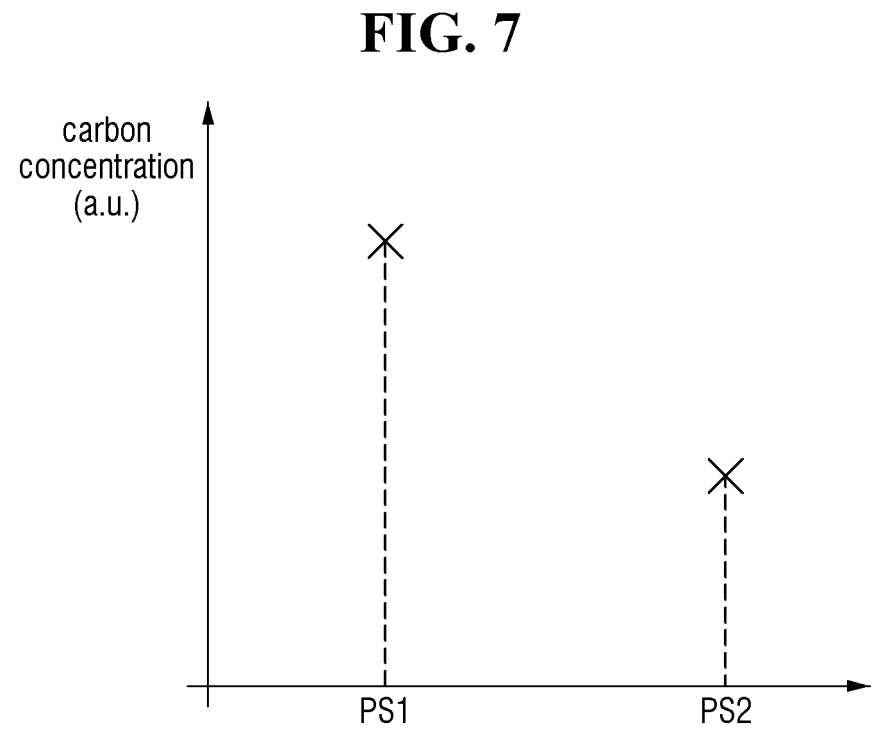
Figure 8:
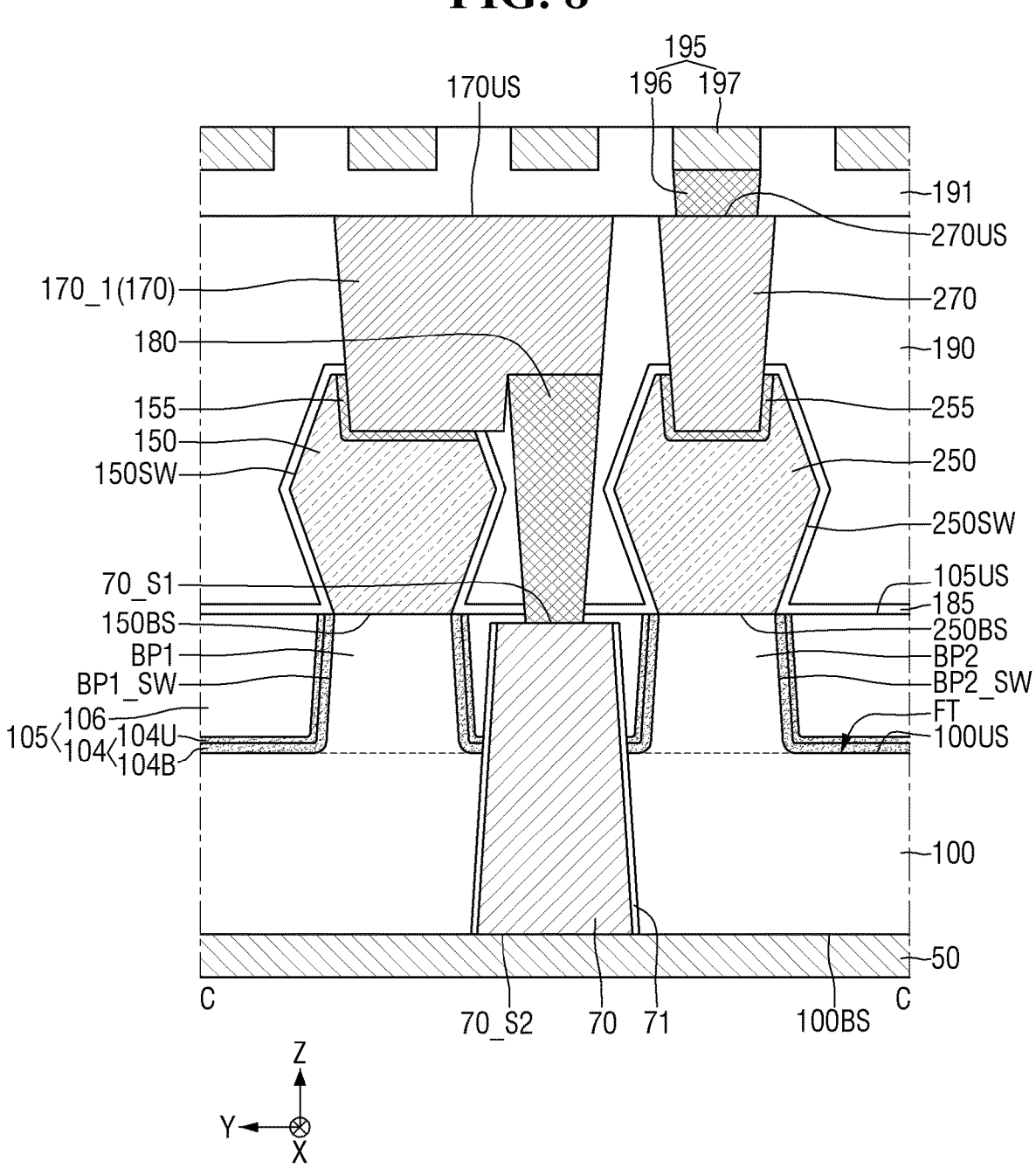
FIGS. 8 and 9 are views for describing semiconductor devices according to some example embodiments, respectively.
Figure 9:
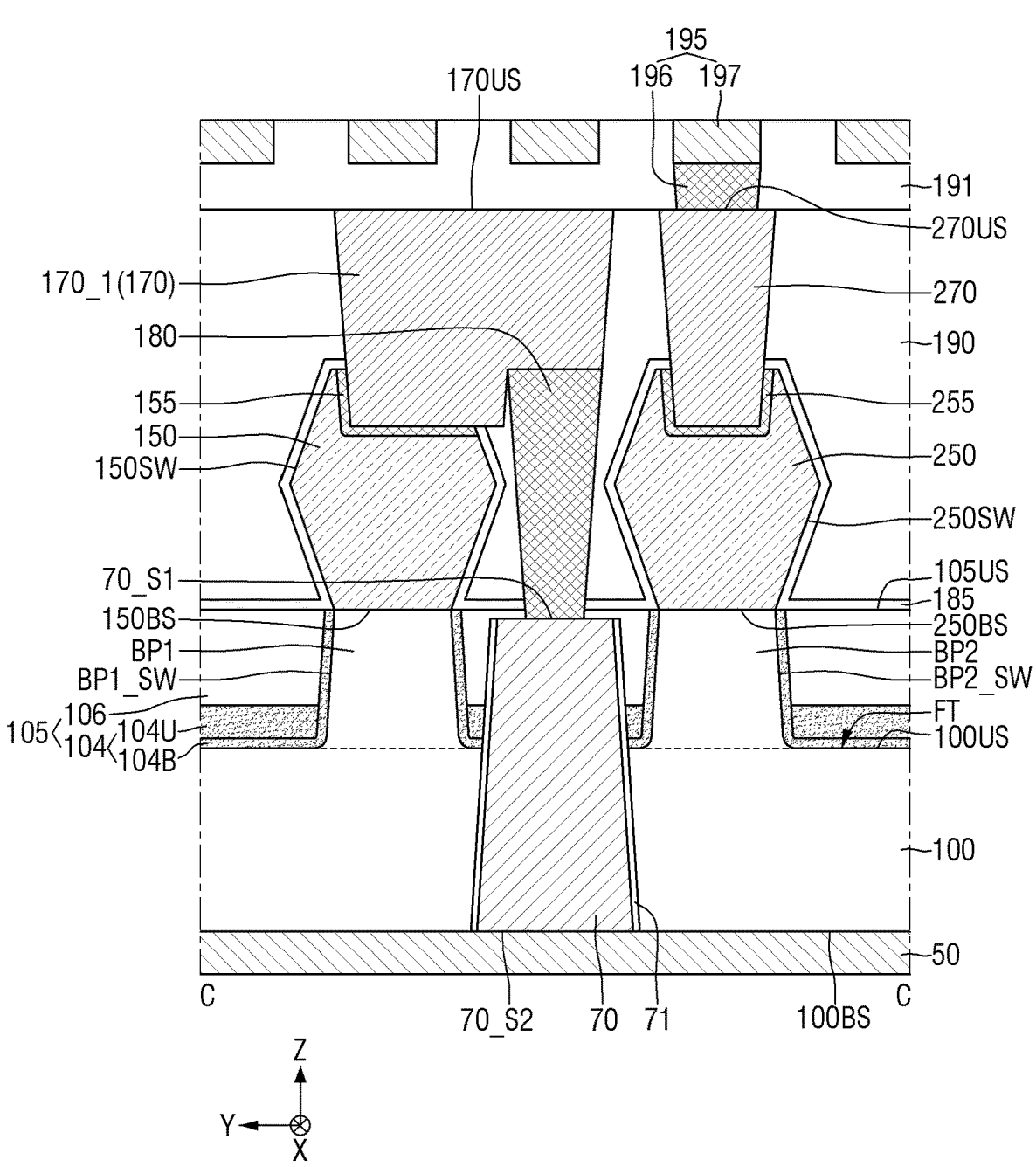

FIGS. 6 and 7 are views for describing a semiconductor device according to some example embodiments. FIGS. 8 and 9 are views for describing semiconductor devices according to some example embodiments, respectively. For convenience of explanation, contents different from those described with reference to FIGS. 1 to 5 will be mainly described. For reference, FIG. 7 is a graph illustrating concentrations of carbon at a first point PS1 and a second point PS2 in FIG. 6.

Referring to FIGS. 6 and 7, in a semiconductor device according to some example embodiments, the first field stop film 104 may include a horizontal portion extending along the first surface 100US of the first substrate, and may not include vertical portions extending along the sidewalls BP1_SW and BP2_SW of the lower patterns.

The first field filling film 106 and the first field stop film 104 may be formed in a laminating form. The entire upper surface 105US of the field insulating film may be defined by the first field filling film 106.

When the first field stop film 104 is made of an insulating material containing carbon, a concentration of carbon included in the first field stop film 104 changes as a distance from the first surface 100US of the first substrate increases. For example, as the distance from the first surface 100US of the first substrate increases, the concentration of carbon included in the first field stop film 104 may decrease. The concentration of carbon included in the first field stop film 104 may be expressed as an atomic percent (at. %). The present disclosure, however, is not limited thereto.

The first field stop film 104 may include the first point PS1 and the second point PS2. A height H21 from the first surface 100US of the first substrate to the first point PS1 may be smaller than a height H22 from the first surface 100US of the first substrate to the second point PS2.

In FIG. 7, a concentration of carbon included in the first field stop film 104 at the first point PS1 may be different from a concentration of carbon included in the first field stop film 104 at the second point PS2. In some embodiments, as the distance from the first surface 100US of the first substrate increases, the concentration of carbon included in the first field stop film 104 may decrease. For example, the concentration of carbon included in the first field stop film 104 at the first point PS1 may be greater from the concentration of carbon included in the first field stop film 104 at the second point PS2.

In some embodiments, as the distance from the first surface 100US of the first substrate increases, the concentration of carbon included in the first field stop film 104 may increase. For example, the concentration of carbon included in the first field stop film 104 at the first point PS1 may be smaller from the concentration of carbon included in the first field stop film 104 at the second point PS2.

The change in the concentration of carbon in the first field stop film 104 may also be applied to the horizontal portion of the first field stop film 104 described with reference to FIGS. 1 to 5. When the change in the concentration of carbon in the first field stop film 104 is applied to the vertical portions of the first field stop film 104, the concentration of carbon in the first field stop film 104 may change as a distance from the sidewalls BP1_SW and BP2_SW of the lower patterns increases. In some embodiments, the concentration of carbon in the first field stop film 104 may increase as the distance from the sidewalls BP1_SW and BP2_SW of the lower patterns increases. In some embodiments, the concentration of carbon in the first field stop film 104 may decrease as the distance from the sidewalls BP1_SW and BP2_SW of the lower patterns increases.

Unlike described above, the concentration of carbon included in the first field stop film 104 may be constant as the distance from the first surface 100US of the first substrate increases.

Referring to FIGS. 8 and 9, in semiconductor devices according to some example embodiments, the first field stop film 104 may include a lower field stop film 104B and an upper field stop film 104U.

The lower field stop film 104B may be disposed between the upper field stop film 104U and the first substrate 100. The lower field stop film 104B and the upper field stop film 104U may include or may be formed of different materials.

In FIG. 8, each of the lower field stop film 104B and the upper field stop film 104U may extend along the sidewall and the bottom surface of the fin trench FT. Each of the lower field stop film 104B and the upper field stop film 104U may include a horizontal portion extending along the first surface 100US of the first substrate and vertical portions extending along the sidewalls BP1_SW and BP2_SW of the lower patterns. The horizontal portion of the lower field stop film 104B may be in contact with the horizontal portion of the upper field stop film 104U. The vertical portions of the lower field stop film 104B may be in contact with the vertical portions of the upper field stop film 104U.

In FIG. 9, the lower field stop film 104B may extend along the sidewall and the bottom surface of the fin trench FT. The lower field stop film 104B may include a horizontal portion extending along the first surface 100US of the first substrate and vertical portions extending along the sidewalls BP1_SW and BP2_SW of the lower patterns. The upper field stop film 104U may include a horizontal portion and may not include vertical portions. For example, no portion of the upper field stop film 104U may not extend along the sidewalls BP1_SW and BP2_SW of the lower patterns above a flat upper surface of the upper field stop film 104U. The horizontal portion of the lower field stop film 104B may be in contact with the horizontal portion of the upper field stop film 104U. A bottom surface of the upper field stop film 104U may face an upper surface of the horizontal portion of the lower field stop film 104B. Side surfaces of the lower field stop film 104B in the second direction Y may be in contact with portions of the vertical portions of the upper field stop film 104U.

In some embodiments, the lower field stop film 104B may include a horizontal portion and may not include vertical portions. The upper field stop film 104U may include a horizontal portion and vertical portions. In this case, the vertical portions of the upper field stop film 104U may be in contact with the sidewalls BP1_SW and BP2_SW of the lower patterns. As another example, each of the lower field stop film 104B and the upper field stop film 104U may include a horizontal portion and may not include vertical portions.

Figure 10:
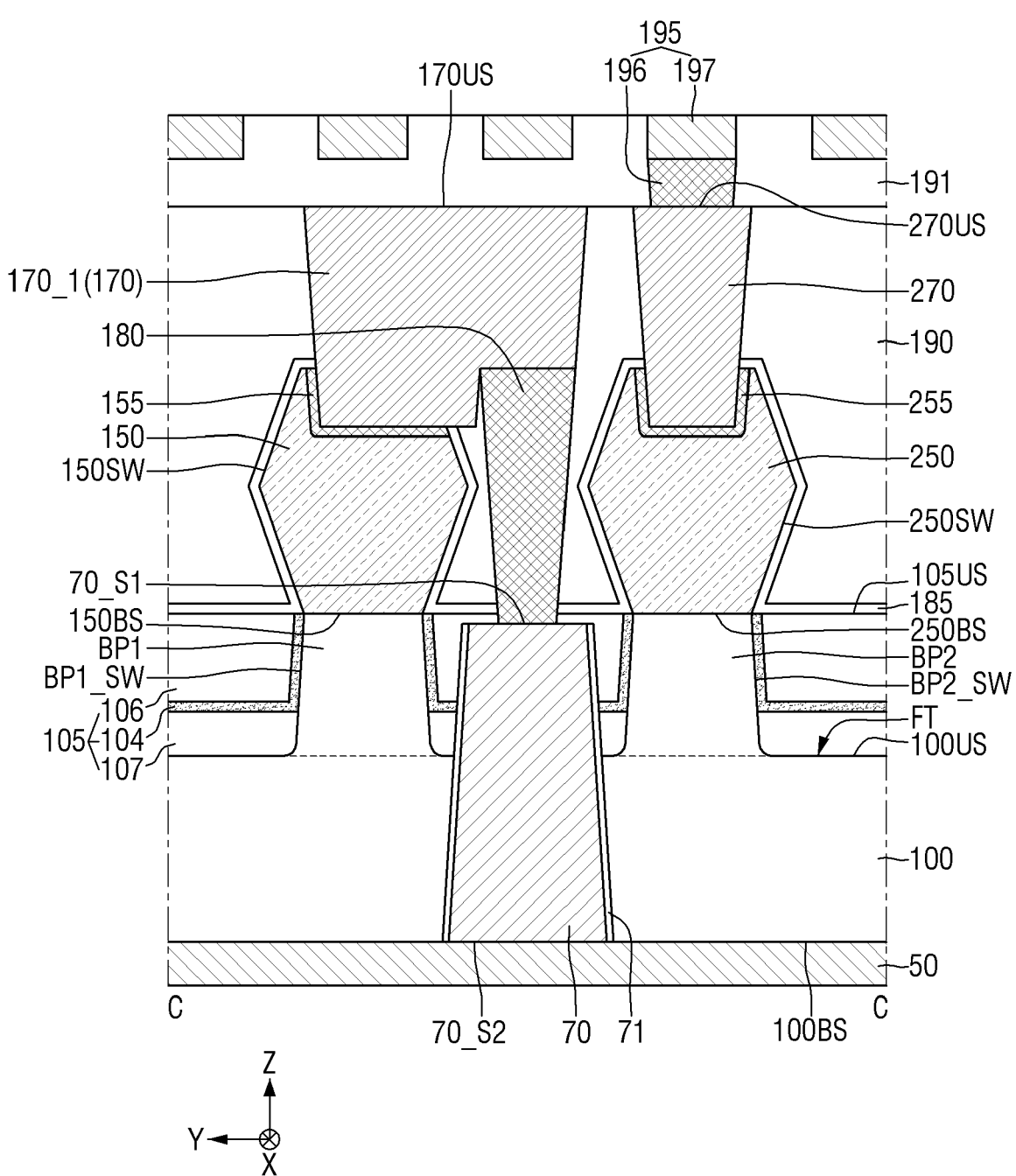
FIGS. 10 and 11 are views for describing semiconductor devices according to some example embodiments, respectively.
Figure 11:
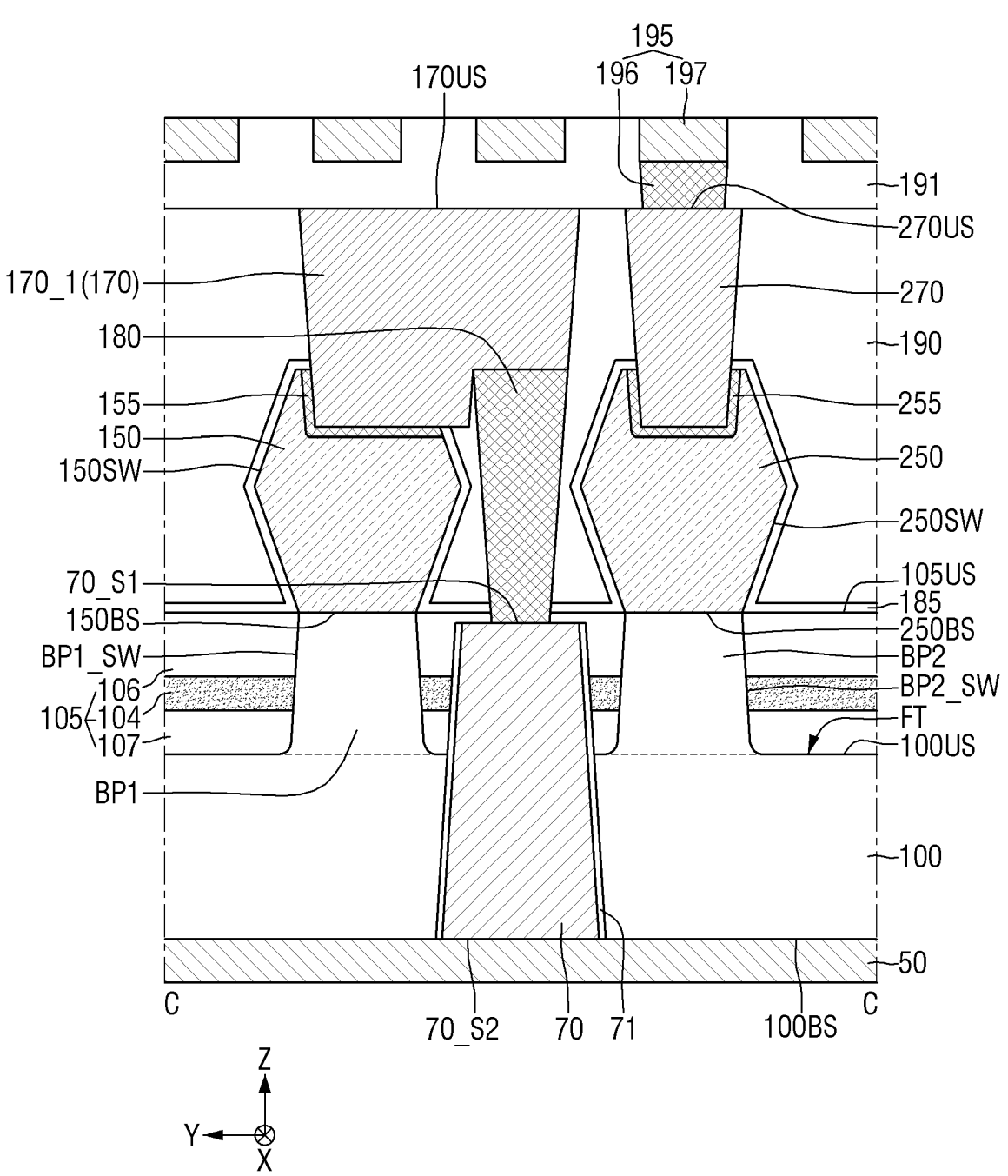

FIGS. 10 and 11 are views for describing semiconductor devices according to some example embodiments, respectively. FIGS. 12 to 15 are views for describing semiconductor devices according to some example embodiments, respectively. For convenience of explanation, contents different from those described with reference to FIGS. 1 to 7 will be mainly described.

Referring to FIGS. 10 and 11, in semiconductor devices according to some example embodiments, the field insulating film 105 may further include a second field filling film 107 disposed between the first substrate 100 and the first field stop film 104.

The first field stop film 104 may include or may be formed of a material having etch selectivity with respect to the second field filling film 107. The second field filling film 107 may include or may be formed of a silicon oxide-based insulating material. The second field filling film 107 may include or may be formed of, for example, silicon oxide.

In FIG. 10, the first field stop film 104 may include a horizontal portion extending along an upper surface of the second field filling film 107 and vertical portions extending along the sidewalls BP1_SW and BP2_SW of the lower patterns. The upper surface of the second field filling film 107 may face the first field filling film 106.

In FIG. 11, the first field stop film 104 may include a horizontal portion extending along an upper surface of the second field filling film 107 and may not include vertical portions extending along the sidewalls BP1_SW and BP2_SW of the lower patterns.

Referring to FIGS. 12 to 15, in semiconductor devices according to some example embodiments, the field insulating film 105 may further include a second field stop film 103 and a second field filling film 107 disposed between the first field filling film 106 and the first field stop film 104.

The second field filling film 107 may be disposed between the first field stop film 104 and the second field stop film 103. The second field stop film 103 may be disposed between the first field filling film 106 and the second field filling film 107.

The first field stop film 104 may include or may be formed of a material having etch selectivity with respect to the first field filling film 106 and the second field filling film 107. The second field stop film 103 may include or may be formed of a material having etch selectivity with respect to the first field filling film 106. The second field filling film 107 may include or may be formed of a silicon oxide-based insulating material. The second field filling film 107 may include or may be formed of, for example, silicon oxide. The second field stop film 103 may include or may be formed of, for example, one of silicon oxycarbide (SiCO), silicon carbonitride (SiCN), hydrogen-doped SiCN (SiCHN), hydrogen-doped SiCO (SiOCH), and aluminum oxide (AlO). The present disclosure, however, is not limited thereto.

Figure 12:
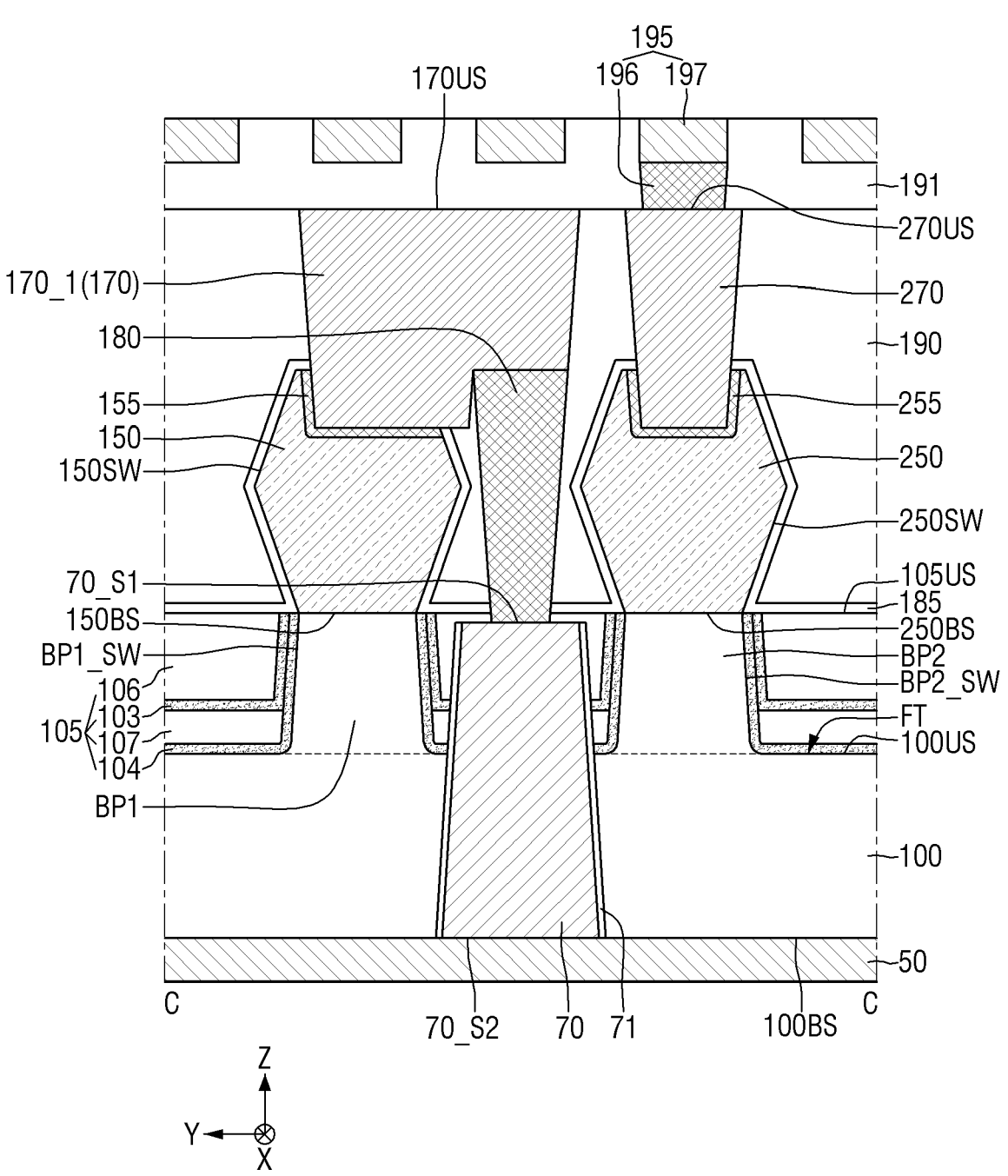
FIGS. 12 to 15 are views for describing semiconductor devices according to some example embodiments, respectively.
Figure 13:
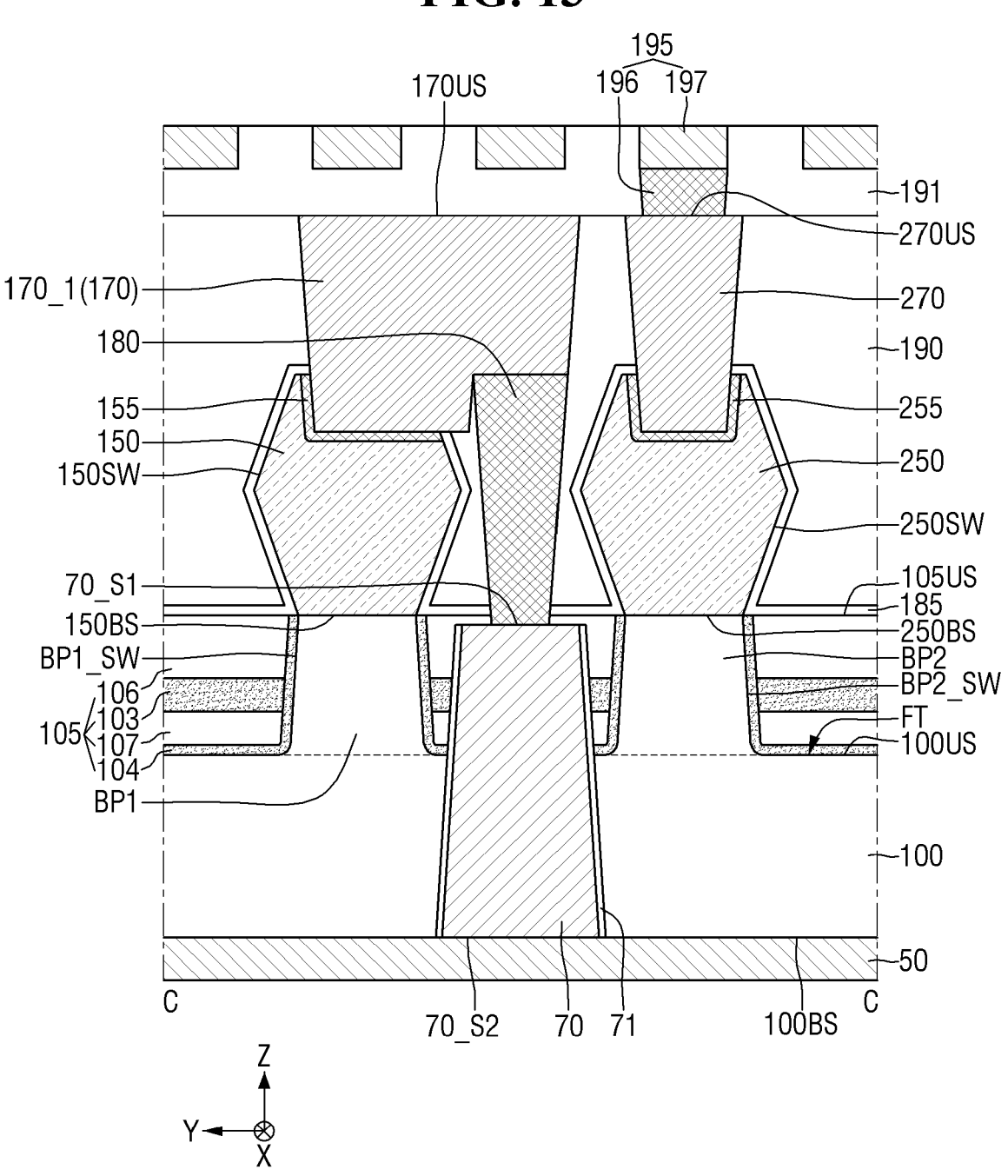

In FIGS. 12 and 13, the first field stop film 104 may include a horizontal portion extending along the first surface 100US of the first substrate and vertical portions extending along the sidewalls BP1_SW and BP2_SW of the lower patterns.

Figure 14:
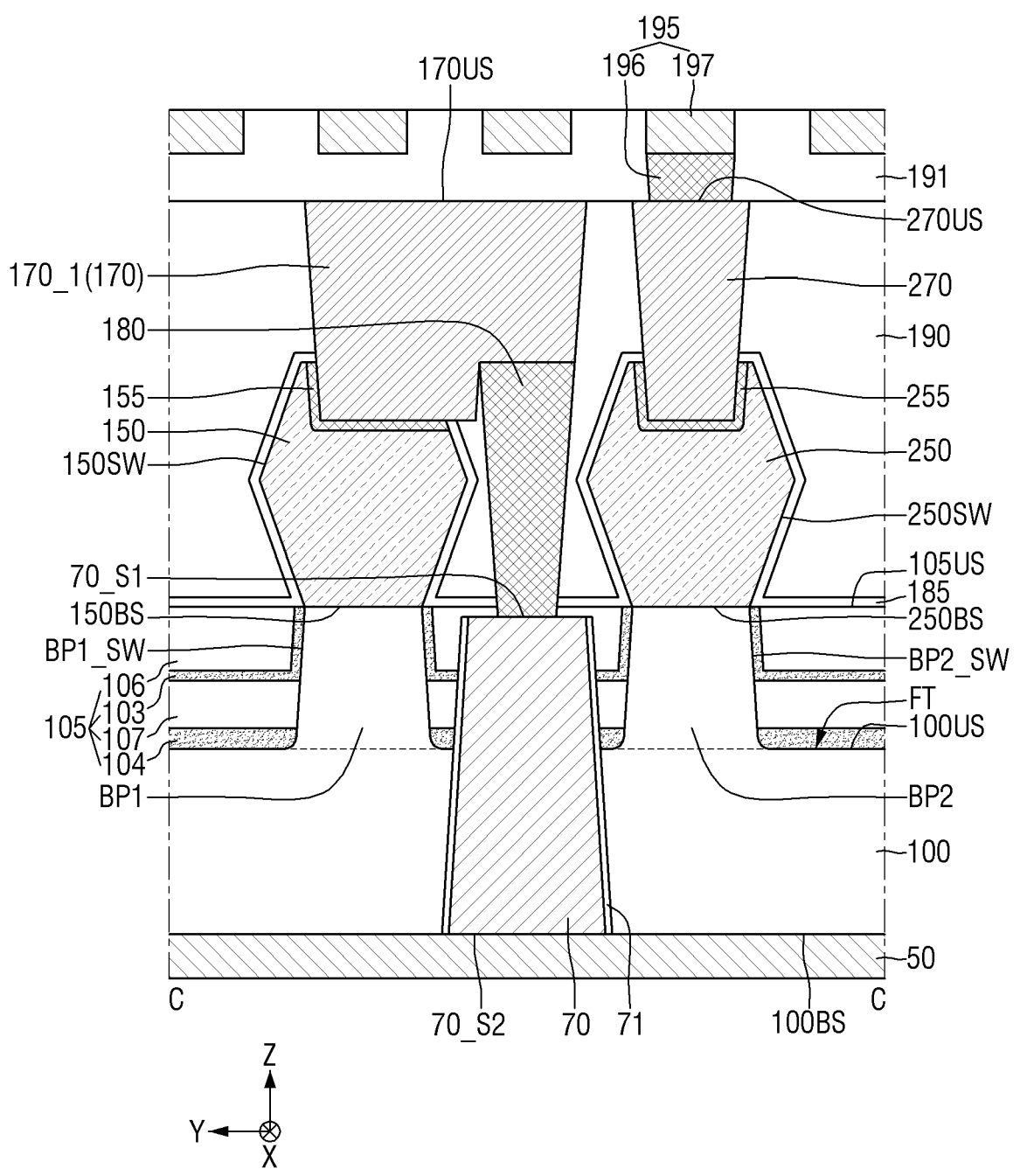
Figure 15:
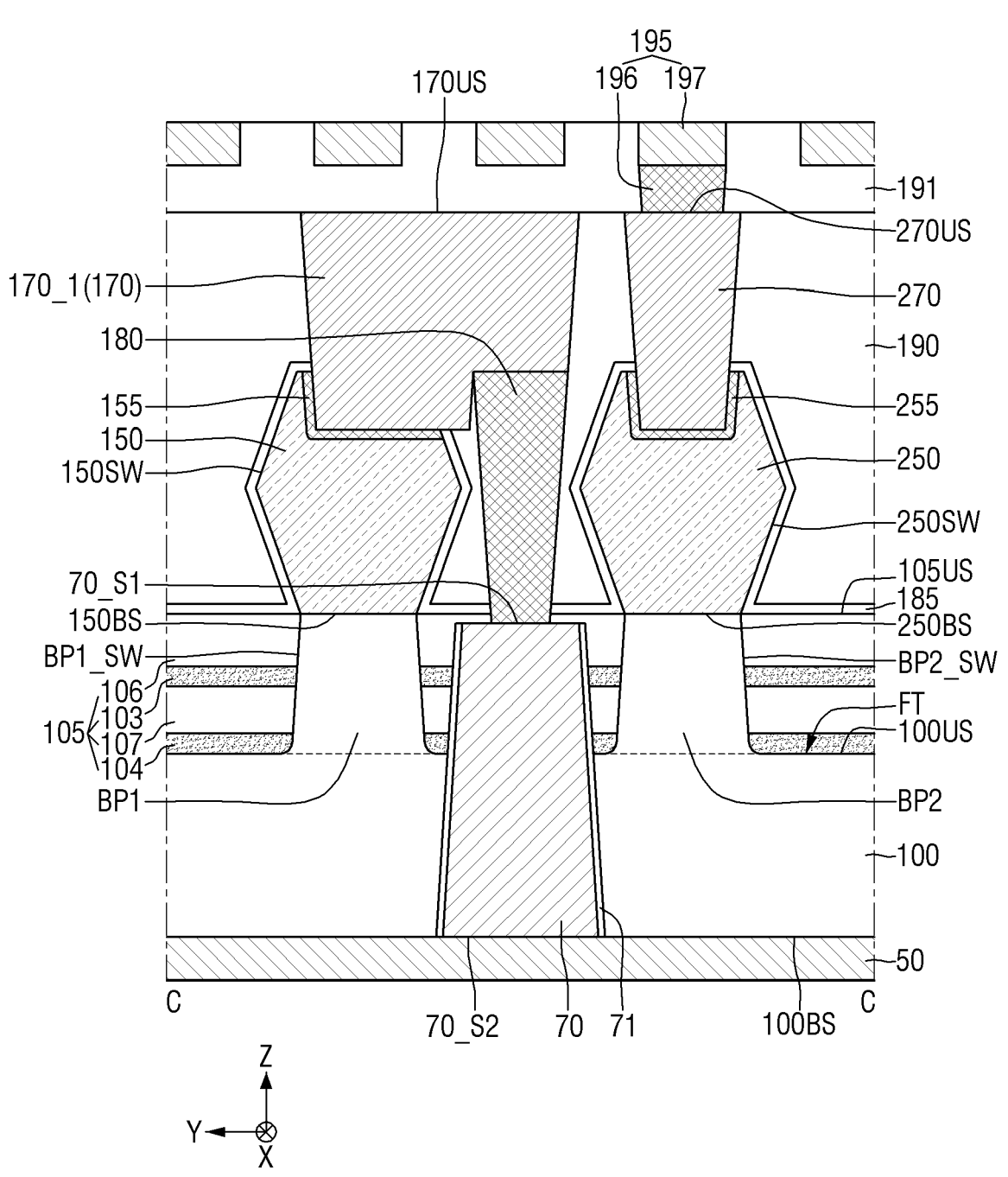

In FIGS. 14 and 15, the first field stop film 104 may include a horizontal portion extending along the first surface 100US of the first substrate and may not include vertical portions extending along the sidewalls BP1_SW and BP2_SW of the lower patterns.

In FIGS. 12 and 14, the second field stop film 103 may include a horizontal portion extending along the upper surface of the second field filling film 107 and vertical portions extending along the sidewalls BP1_SW and BP2_SW of the lower patterns.

In FIGS. 13 and 15, the second field stop film 103 may include a horizontal portion extending along the upper surface of the second field filling film 107 and may not include vertical portions extending along the sidewalls BP1_SW and BP2_SW of the lower patterns.

Figure 16:
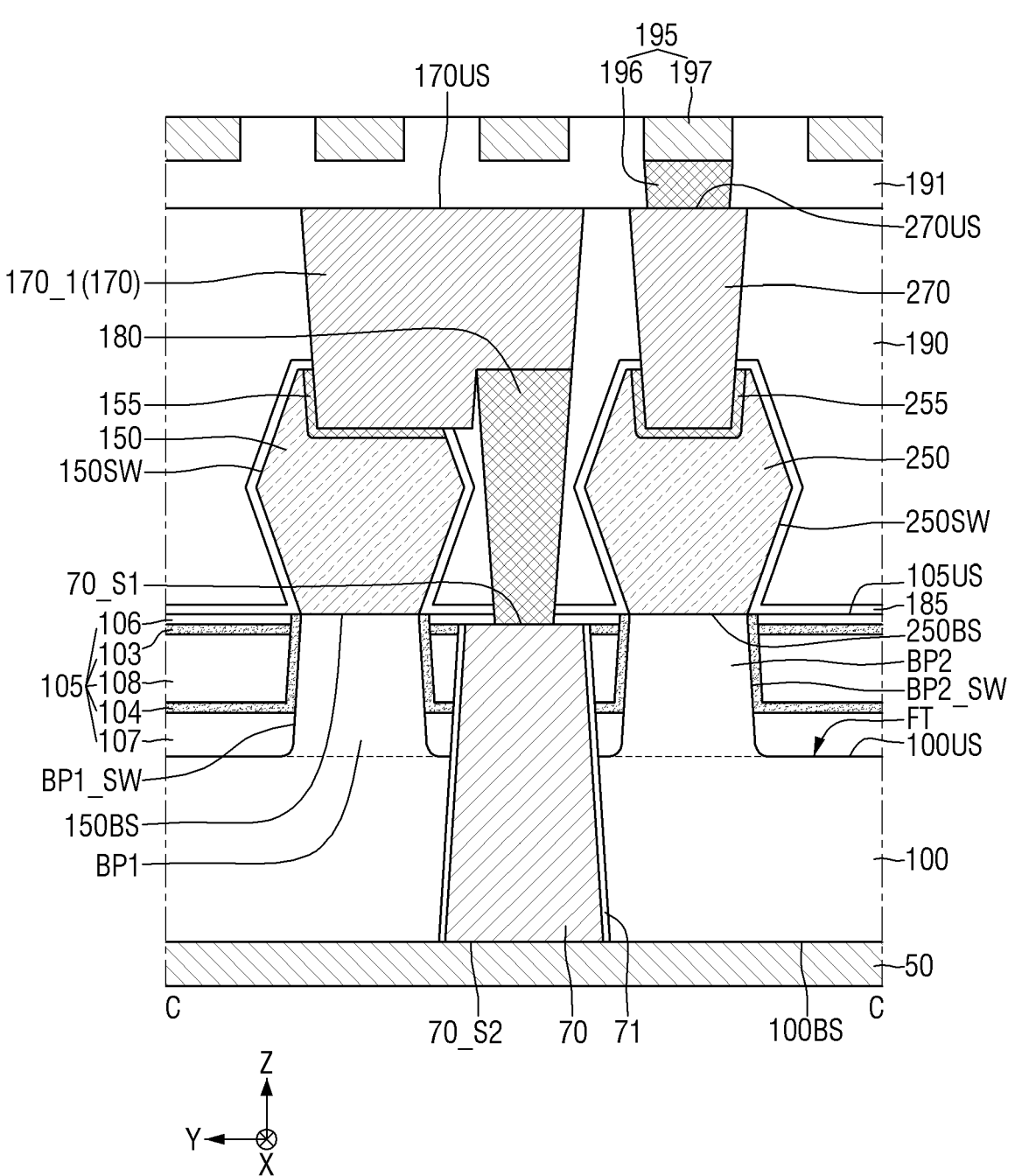
FIGS. 16 and 17 are views for describing semiconductor devices according to some example embodiments, respectively.
Figure 17:
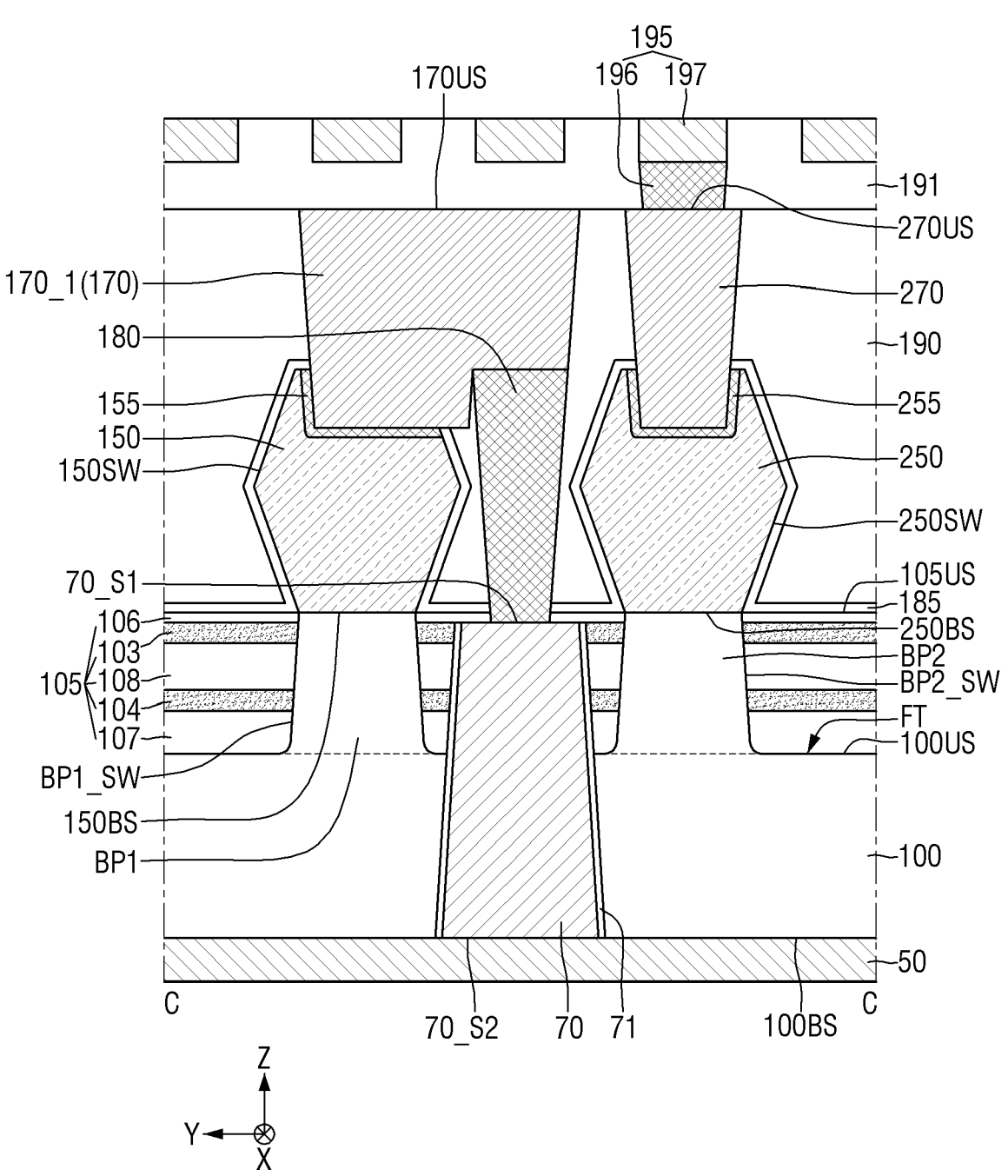

FIGS. 16 and 17 are views for describing semiconductor devices according to some example embodiments, respectively. For convenience of explanation, contents different from those described with reference to FIGS. 1 to 7 and 10 and 11 will be mainly described.

Referring to FIGS. 16 and 17, in semiconductor devices according to some example embodiments, the field insulating film 105 may further include a second field stop film 103 and a third field filling film 108 disposed between the first field filling film 106 and the first field stop film 104.

The third field filling film 108 may be disposed between the first field stop film 104 and the second field stop film 103. The second field stop film 103 may be disposed between the first field filling film 106 and the third field filling film 108.

The first field stop film 104 may include or may be formed of a material having etch selectivity with respect to the second field filling film 107 and the third field filling film 108. The second field stop film 103 may include or may be formed of a material having etch selectivity with respect to the first field filling film 106 and the third field filling film 108. The third field filling film 108 may include or may be formed of a silicon oxide-based insulating material. The third field filling film 108 may include or may be formed of, for example, silicon oxide. The second field stop film 103 may include or may be formed of, for example, one of silicon oxycarbide (SiCO), silicon carbonitride (SiCN), hydrogen-doped SiCN (SiCHN), hydrogen-doped SiCO (SiOCH), and aluminum oxide (AlO). The present disclosure, however, is not limited thereto.

The second field stop film 103 may include a horizontal portion extending along an upper surface of the third field filling film 108 and may not include vertical portions extending along the sidewalls BP1_SW and BP2_SW of the lower patterns. The upper surface of the third field filling film 108 may face the first field filling film 106.

In some embodiments, the second field stop film 103 may include a horizontal portion extending along the upper surface of the third field filling film 108 and vertical portions extending along the sidewalls BP1_SW and BP2_SW of the lower patterns.

Figure 18:
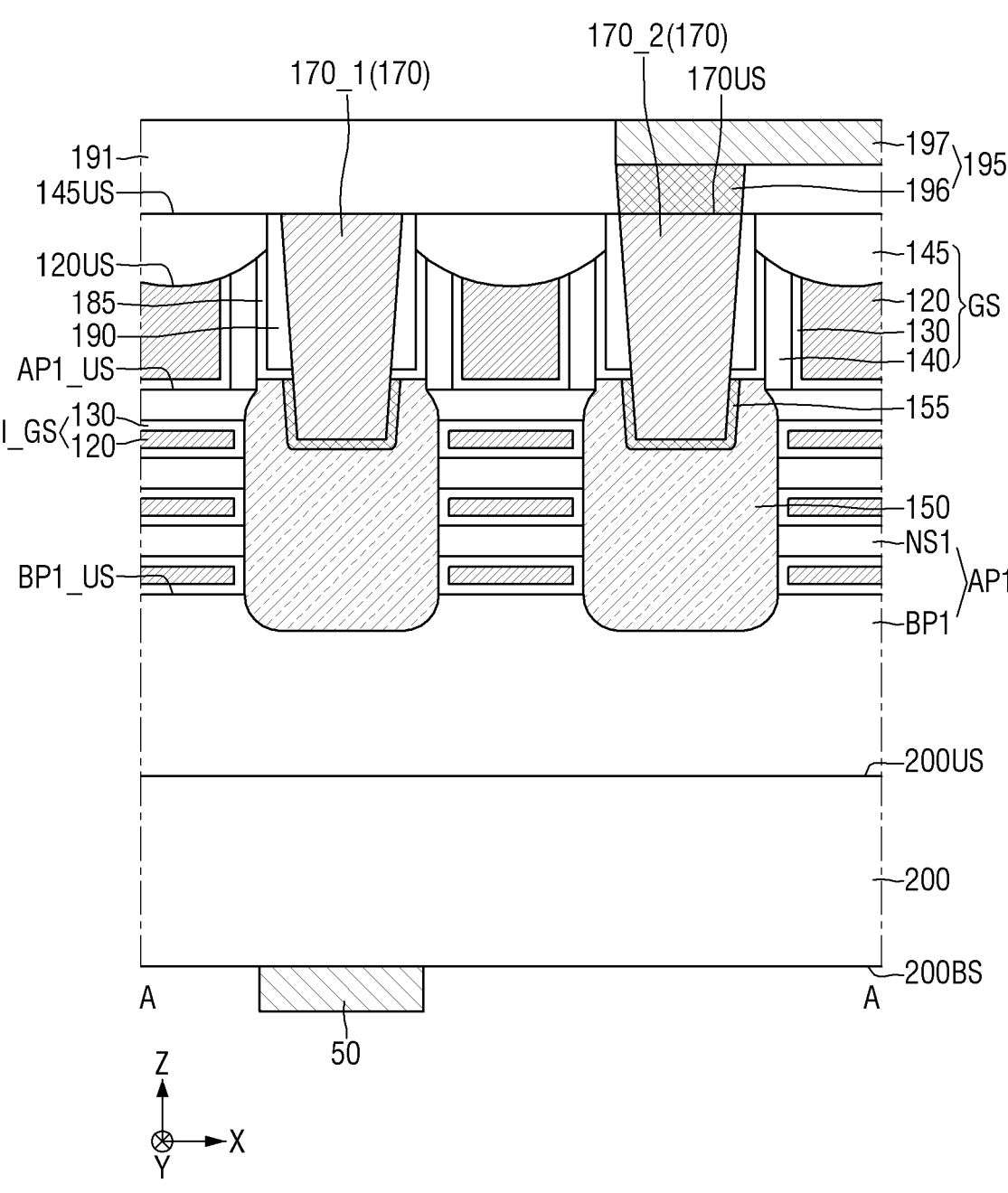
FIGS. 18 to 20 are views for describing a semiconductor device according to some example embodiments.
Figure 19:
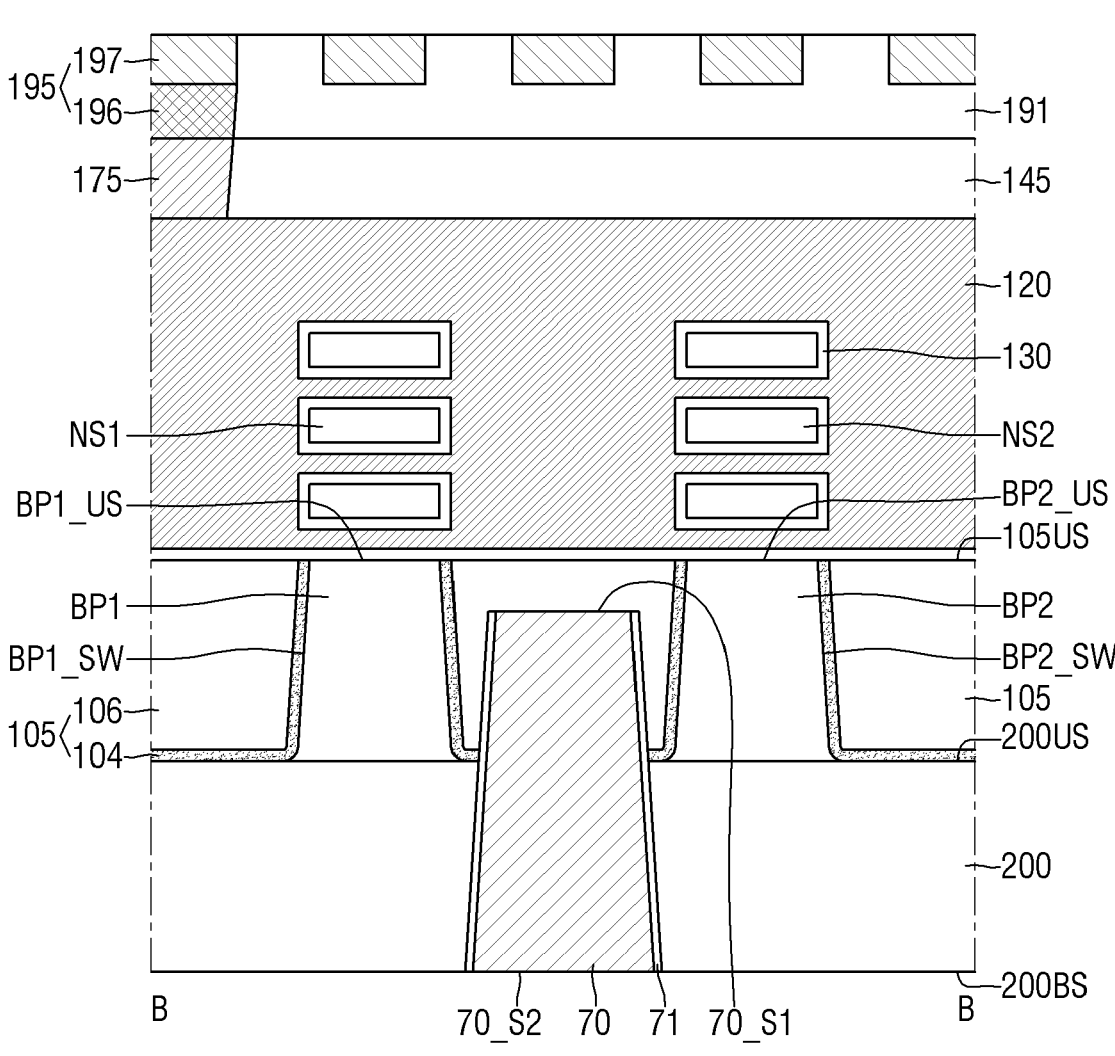
Figure 19:
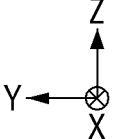
Figure 20:
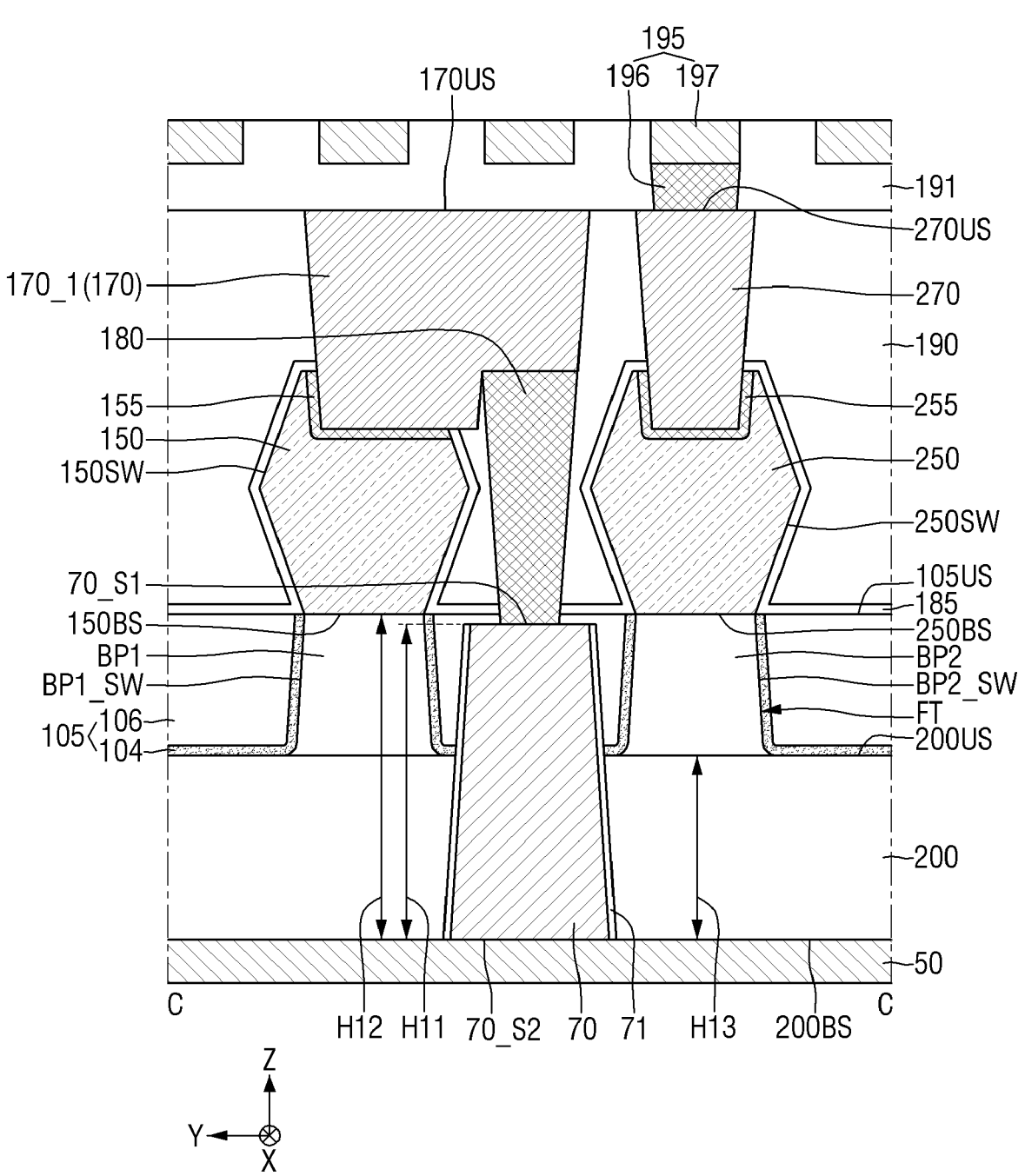
Figure 21:
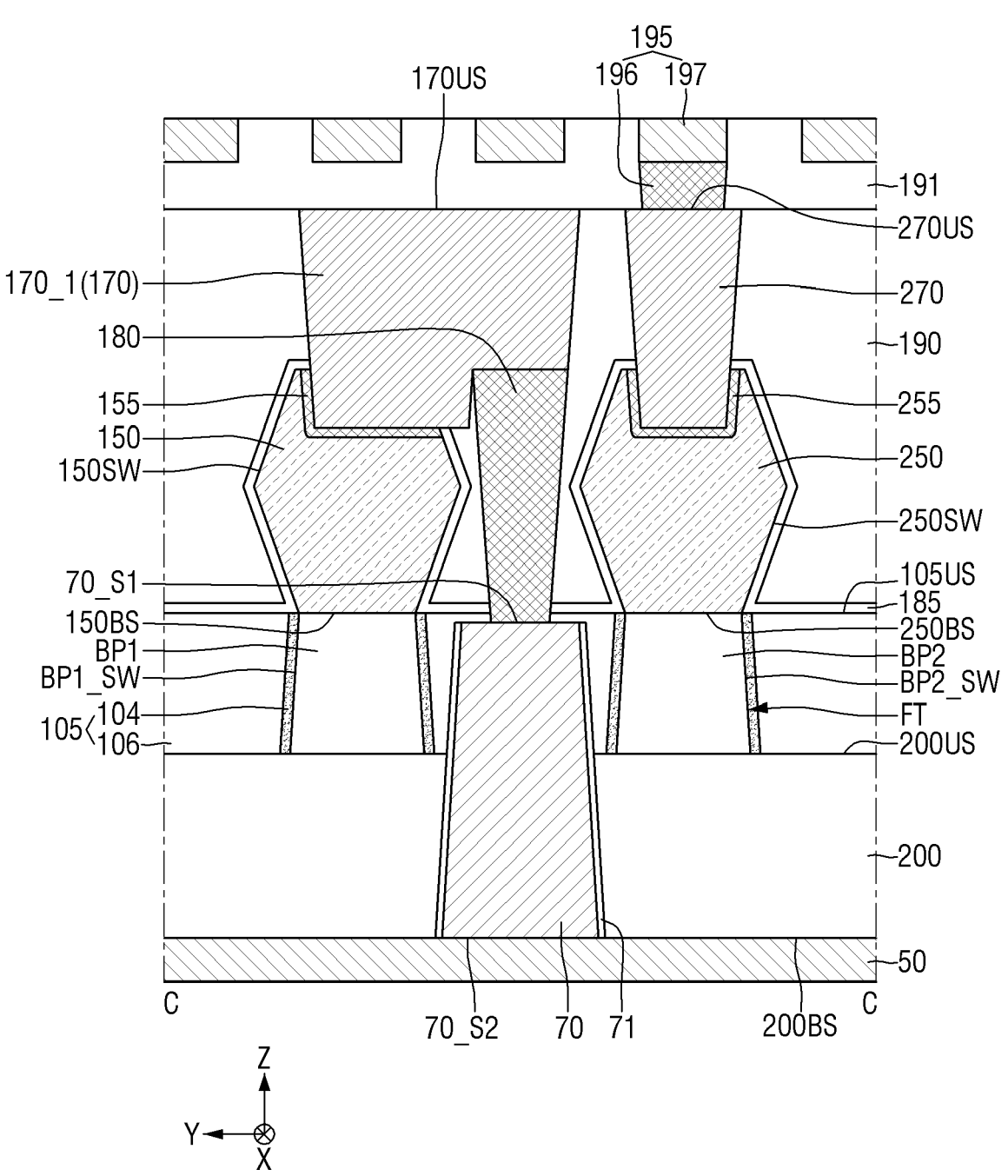
FIG. 21 is a view for describing a semiconductor device according to some example embodiments.

FIGS. 18 to 20 are views for describing a semiconductor device according to some example embodiments. FIG. 21 is a view for describing a semiconductor device according to some example embodiments. For convenience of explanation, contents different from those described with reference to FIGS. 1 to 5 will be mainly described.

Referring to FIGS. 18 to 20, a semiconductor device according to some example embodiments may include a second substrate 200 made of an insulating material.

The second substrate 200 may include a first surface 200US and a second surface 200BS opposite to each other in the third direction Z. Since the gate electrode 120, the first source/drain pattern 150, and the second source/drain pattern 250 may be disposed on the first surface 200US of the second substrate, the first surface 200US of the second substrate may be an upper surface of the second substrate 200. The second surface 200BS of the second substrate opposite to the first surface 200US of the second substrate may be a bottom surface of the second substrate 200.

The second substrate 200 may include or may be formed of at least one of silicon oxide, silicon nitride, and a combination thereof.

The first active pattern AP1 and the second active pattern AP2 may be disposed on the first surface 200US of the second substrate. Each of the first lower pattern BP1 and the second lower pattern BP2 may protrude from the first surface 200US of the second substrate. The first surface 200US of the second substrate may be a bottom surface of the fin trench FT. The first sheet pattern NS1 and the second sheet pattern NS2 may be disposed on the first surface 200US of the second substrate.

The field insulating film 105 may be disposed on the second substrate 200. For example, the field insulating film 105 may be disposed on the first surface 200US of the second substrate. The field insulating film 105 may be disposed on the second substrate 200 between the first lower pattern BP1 and the second lower pattern BP2.

The field insulating film 105 may include a first field filling film 106 and a first field stop film 104 disposed on the first surface 200US of the second substrate. In FIG. 20, the first field stop film 104 may extend along the first surface 200US of the second substrate and the sidewalls BP1_SW and BP2_SW of the lower patterns. In FIG. 21, the first field stop film 104 may extend along the sidewalls BP1_SW and BP2_SW of the lower patterns, but may not extend along the first surface 200US of the second substrate.

After the front wiring structure 195 is formed, the first substrate 100 as illustrated in FIGS. 2 to 5 may be removed. The first substrate 100 may be removed, and thus, the first lower pattern BP1, the second lower pattern BP2, and the field insulating film 105 may be exposed. The second substrate 200 may be formed on the exposed first lower pattern BP1, second lower pattern BP2, and field insulating film 105. Subsequently, a buried conductive pattern 70 may be formed.

During a time when the first substrate 100 is removed, the first field stop film 104 extending along the bottom surface of the fin trench FT of FIG. 4 may be removed. In this case, a field insulating film 105 illustrated in FIG. 21 may be formed.

In some embodiments, before the first substrate 100 is removed, the field insulating film 105 may have a shape as illustrated in FIG. 6. During a time when the first substrate 100 is removed, at least a portion of the first field stop film 104 extending along the bottom surface of the fin trench FT of FIG. 6 may be removed. When a portion of the first field stop film 104 is removed, a shape of the field insulating film 105 disposed on the first surface 200US of the second substrate may be similar to that of FIG. 6.

A height H11 from the second surface 200BS of the second substrate to the first surface 70_S1 of the buried conductive pattern may be greater than a height H13 from the second surface 200BS of the second substrate to the first surface 200US of the second substrate. The height H13 from the second surface 200BS of the second substrate to the first surface 200US of the second substrate may be a thickness of the second substrate 200.

The height H11 from the second surface 200BS of the second substrate to the first surface 70_S1 of the buried conductive pattern may be smaller than or equal to a height H12 from the second surface 200BS of the second substrate to the bottom surface 150BS of the first source/drain pattern.

The rear wiring line 50 may be disposed on the second surface 200BS of the second substrate.

Figure 22:
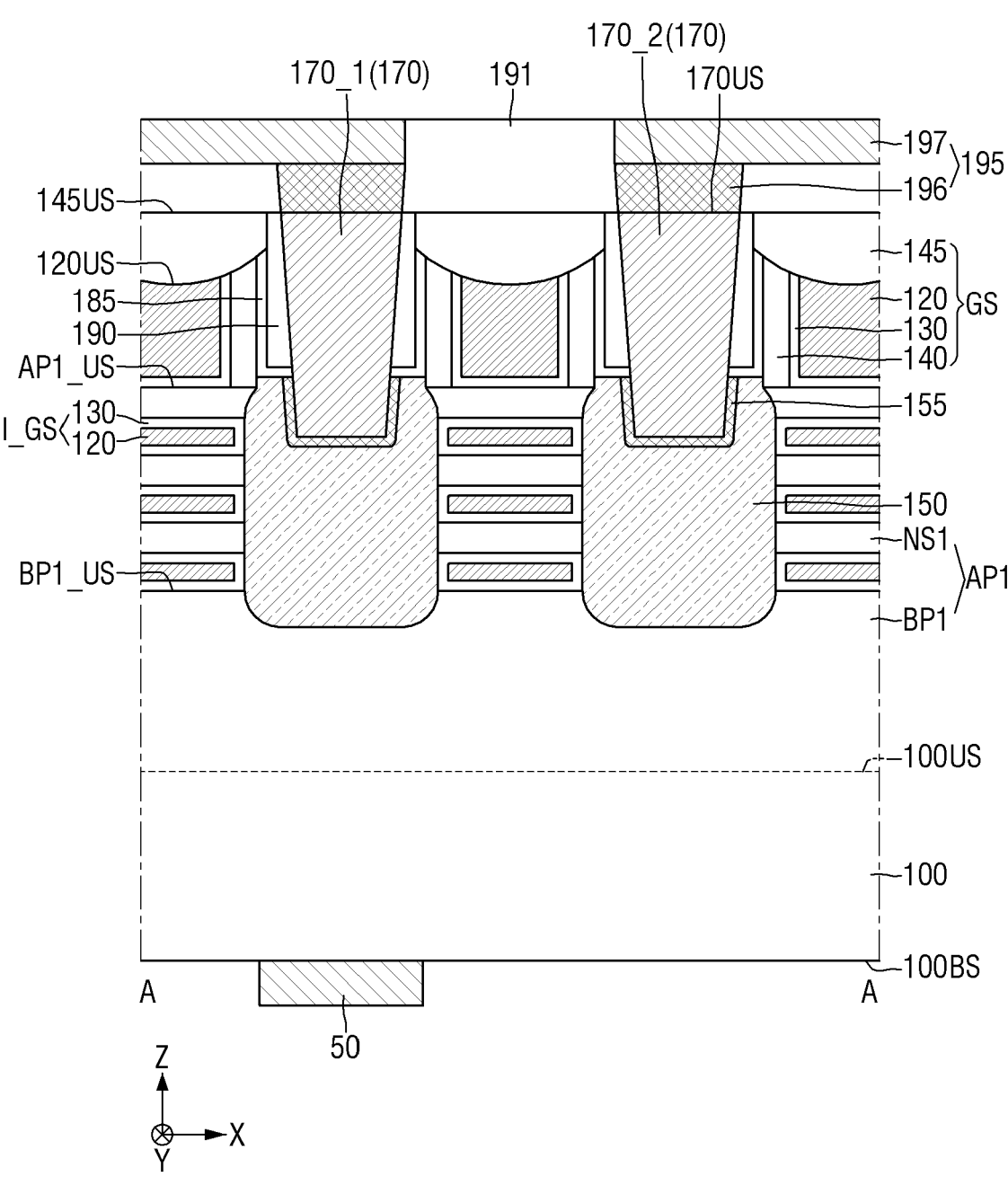
FIGS. 22 and 23 are views for describing a semiconductor device according to some example embodiments.
Figure 23:
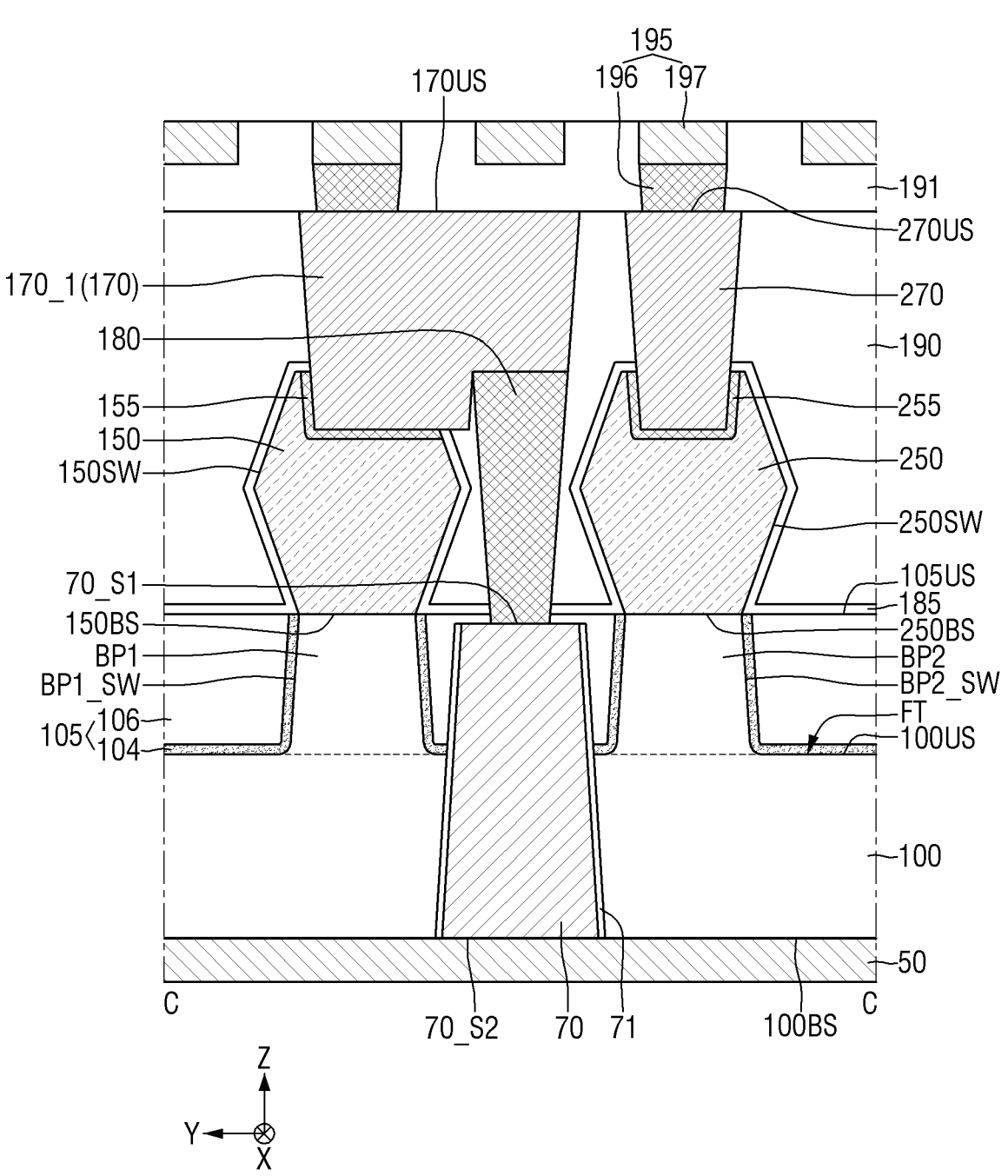
Figure 24:
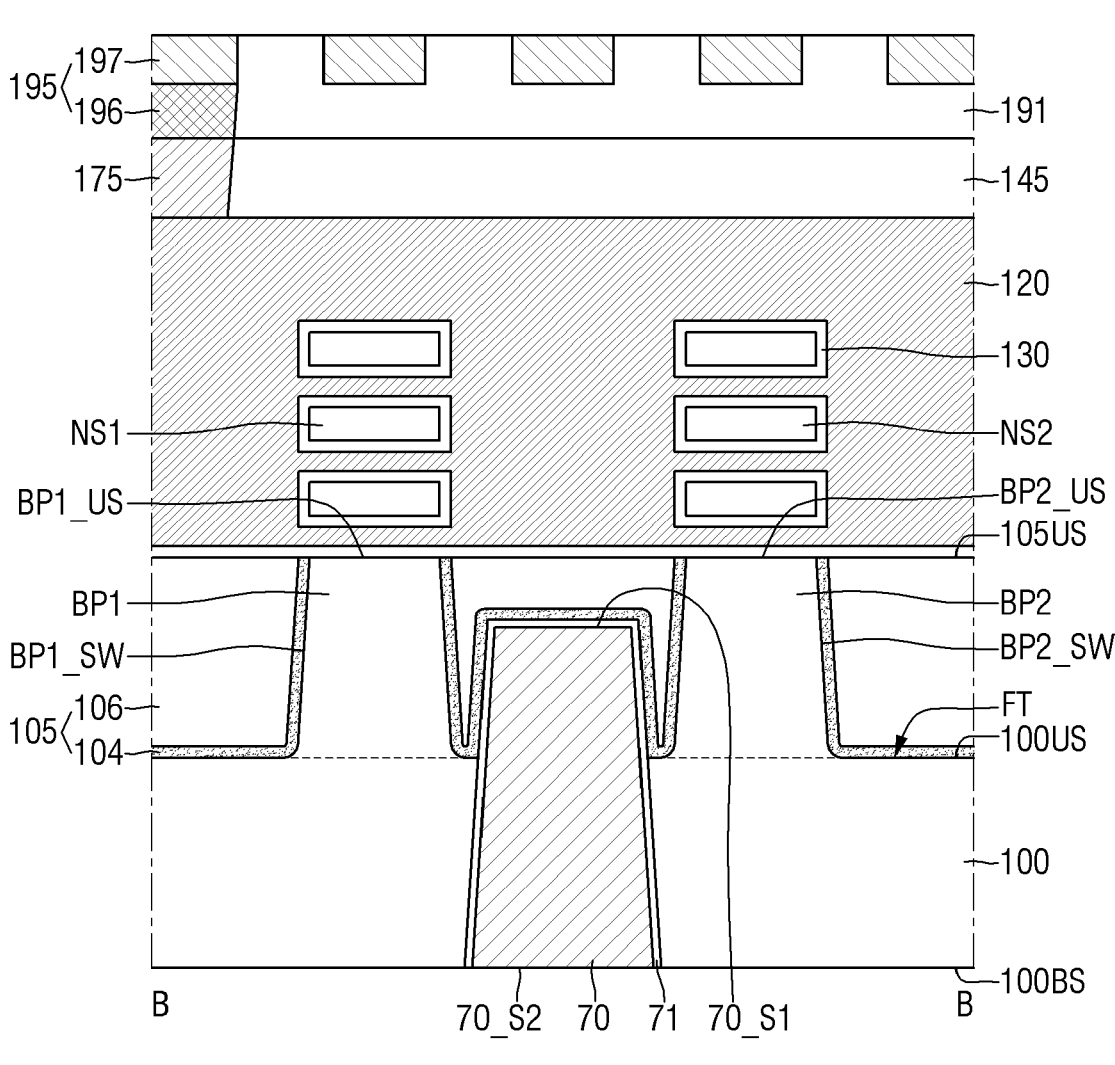
FIGS. 24 and 25 are views for describing a semiconductor device according to some example embodiments.
Figure 24:
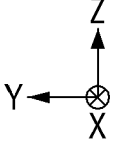
Figure 25:
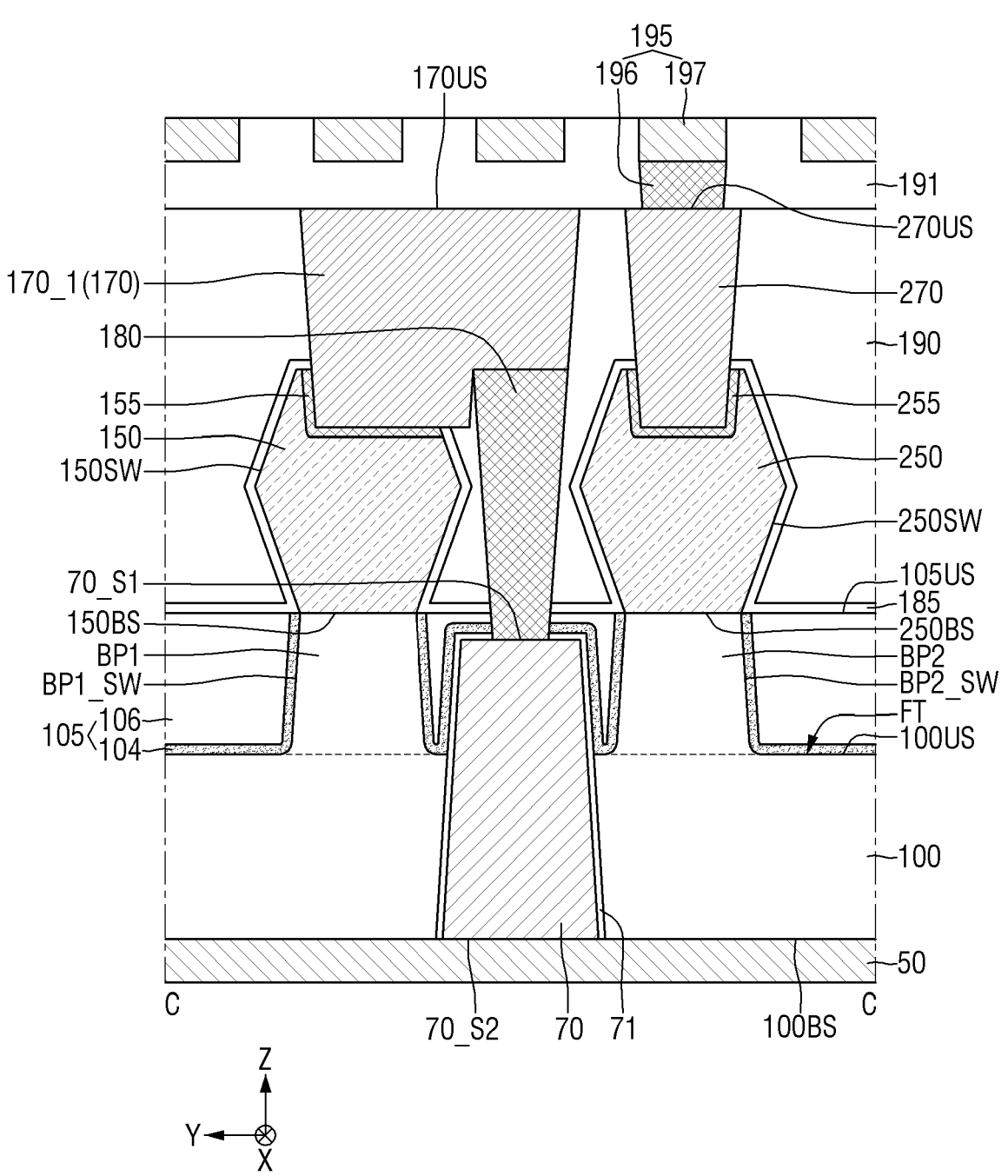

FIGS. 22 and 23 are views for describing a semiconductor device according to some example embodiments. FIGS. 24 and 25 are views for describing a semiconductor device according to some example embodiments. For convenience of explanation, contents different from those described with reference to FIGS. 1 to 5 will be mainly described.

Referring to FIGS. 22 and 23, in a semiconductor device according to some example embodiments, the first rear connection contact 170_1 may be connected not only to the rear wiring line 50 but also to the front wiring structure 195.

The front via plug 196 may connect the first rear connection contact 170_1 and the front wiring line 197 to each other.

Referring to FIGS. 24 and 25, in a semiconductor device according to some example embodiments, the first field stop film 104 may extend along the sidewall of the buried conductive pattern 70 and the first surface 70_S1 of the buried conductive pattern.

The buried insulating liner 71 may extend along the first surface 70_S1 of the buried conductive pattern.

The contact connection via 180 may penetrate through the first field stop film 104 and the buried insulating liner 71 and be connected to the first surface 70_S1 of the buried conductive pattern.

The buried conductive pattern 70 of FIGS. 24 and 25 may be formed before the first source/drain pattern 150 and the second source/drain pattern 250 are formed.

Figure 26:
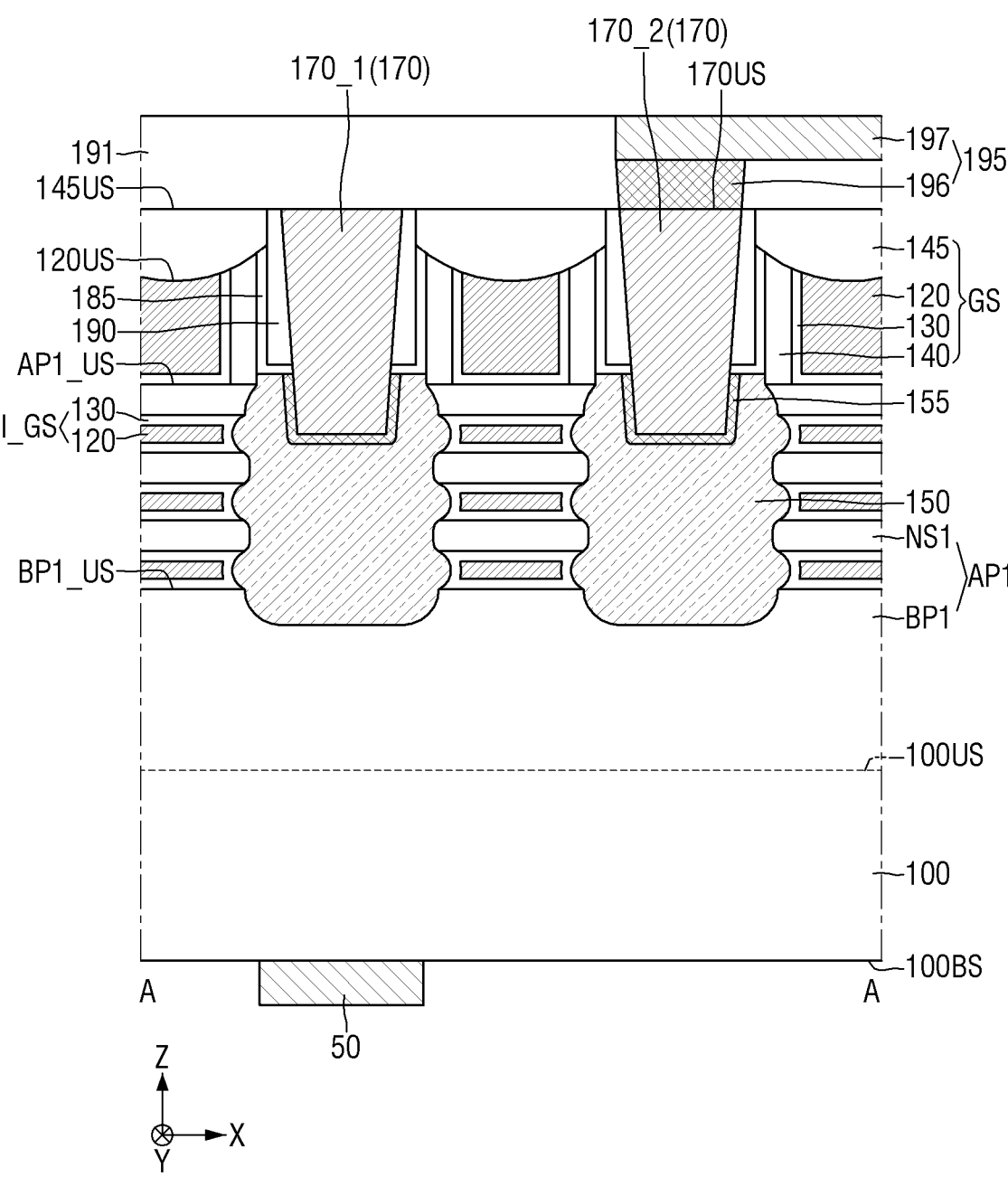
FIGS. 26 and 27 are views for describing semiconductor devices according to some example embodiments, respectively.
Figure 27:
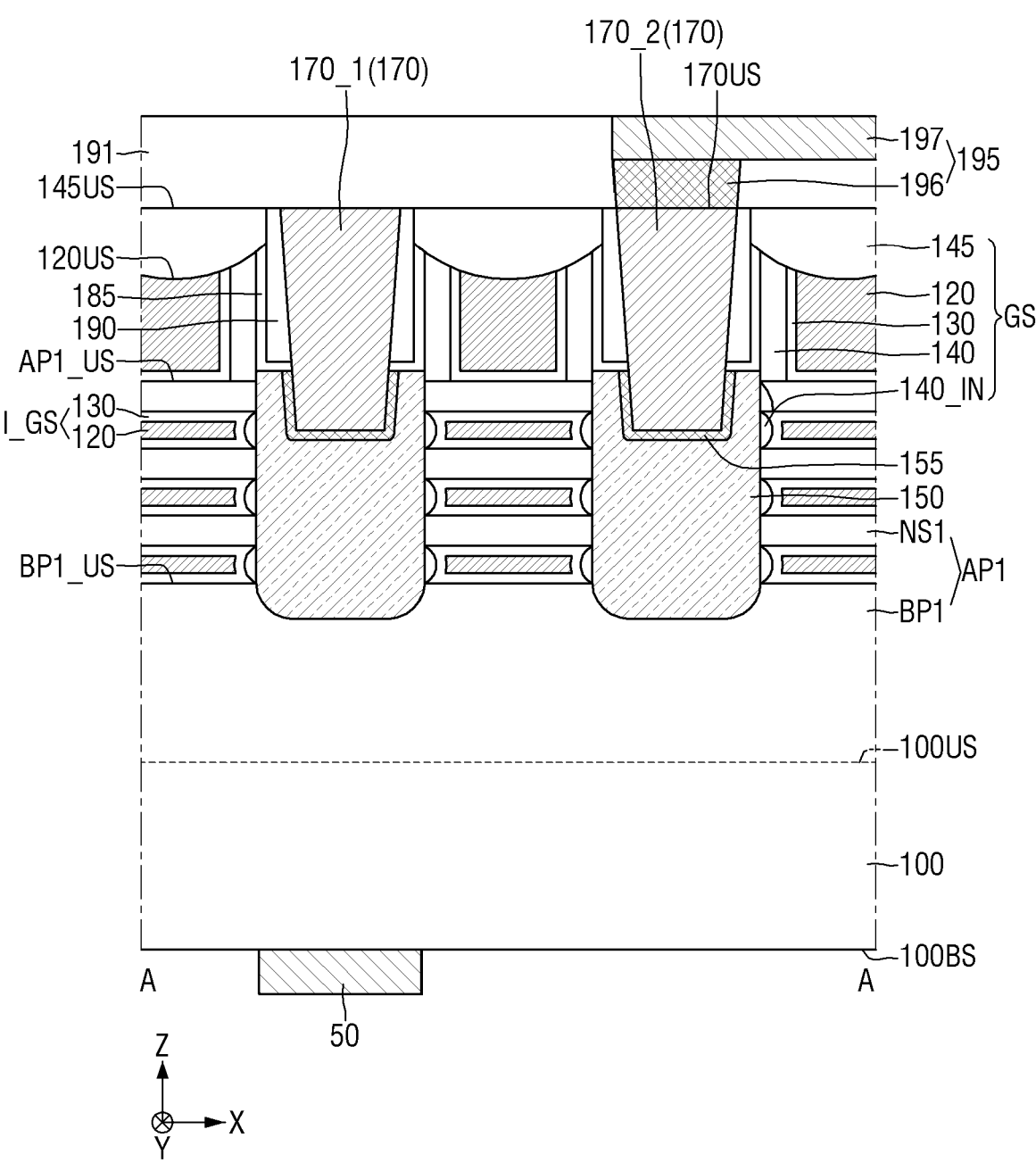
Figure 28:
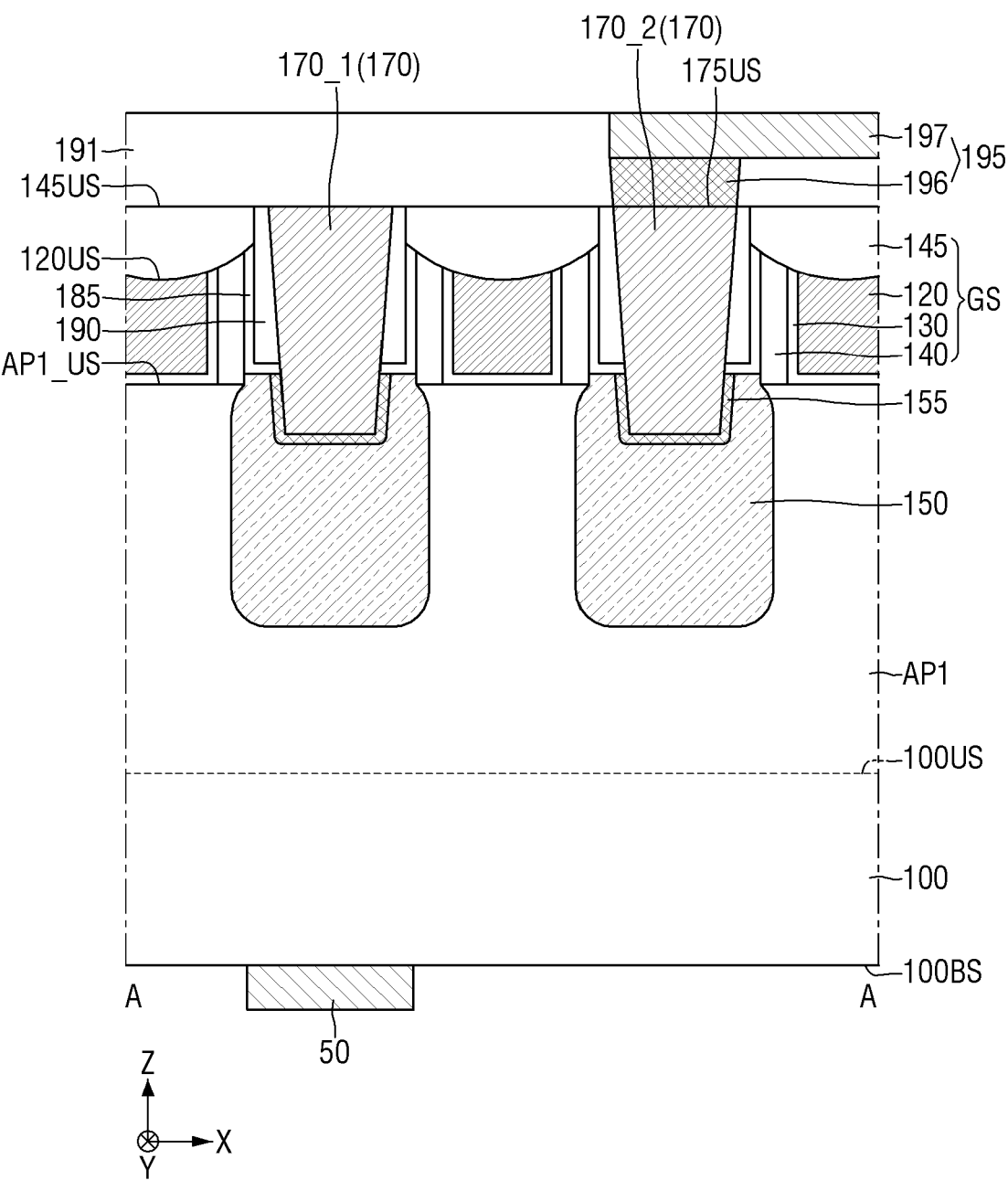
FIGS. 28 and 29 are views for describing a semiconductor device according to some example embodiments.
Figure 29:
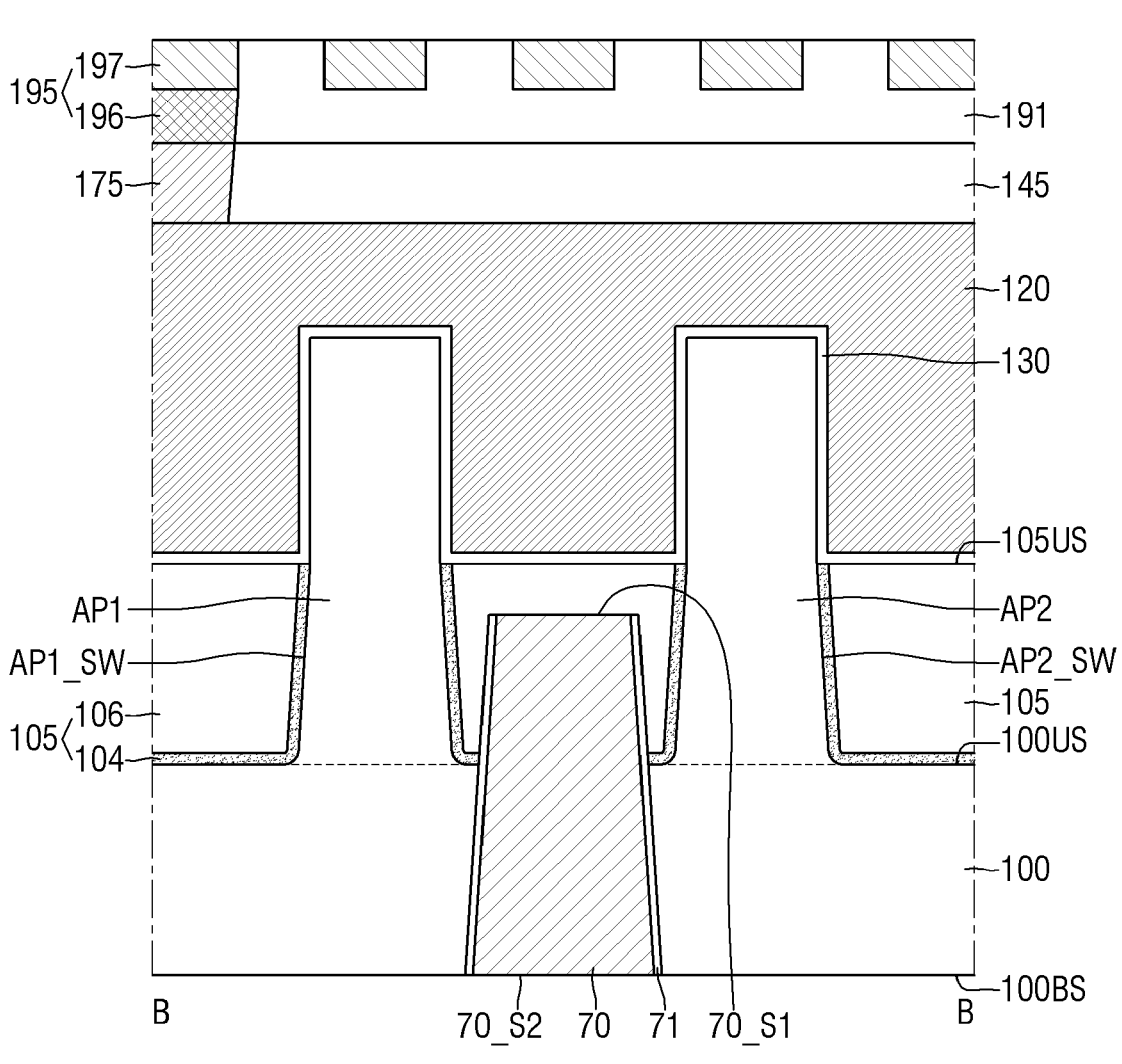
Figure 29:
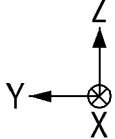

FIGS. 26 and 27 are views for describing semiconductor devices according to some example embodiments, respectively. FIGS. 28 and 29 are views for describing a semiconductor device according to some example embodiments. For convenience of explanation, contents different from those described with reference to FIGS. 1 to 5 will be mainly described.

Referring to FIG. 26, in a semiconductor device according to some example embodiments, the first source/drain pattern 150 may include an outer sidewall contacting the first sheet pattern NS1 and the inner gate structure I_GS.

The outer sidewall of the first source/drain pattern 150 may have a wavy shape.

Referring to FIG. 27, in a semiconductor device according to some example embodiments, the gate structure GS may further include a plurality of inner spacers 140_IN.

The inner spacers 140_IN may be disposed between the first sheet patterns NS1 adjacent to each other in the third direction D3 and between the first lower pattern BP1 and the first sheet pattern NS1. The inner spacers 140_IN may be disposed in spaces between the inner gate structures I_GS and the first source/drain pattern 150. The inner gate structure I_GS may not be in contact with the first source/drain pattern 150.

Referring to FIGS. 28 and 29, in a semiconductor device according to some example embodiments, each of the first active pattern AP1 and the second active pattern AP2 does not include sheet pattern.

The first active pattern AP1 and the second active pattern AP2 may be fin-shaped patterns protruding above the upper surface 105US of the field insulating film. In FIG. 29, the field insulating film 105 may cover a portion of a sidewall AP1_SW of the first active pattern and a portion of a sidewall AP2_SW of the second active pattern.

The gate structure GS does not include the inner gate structure I_GS (see FIG. 2).

FIGS. 30 to 33 are views for describing a semiconductor device according to some example embodiments. For convenience of explanation, contents different from those described with reference to FIGS. 1 to 5 will be mainly described.

Figure 30:
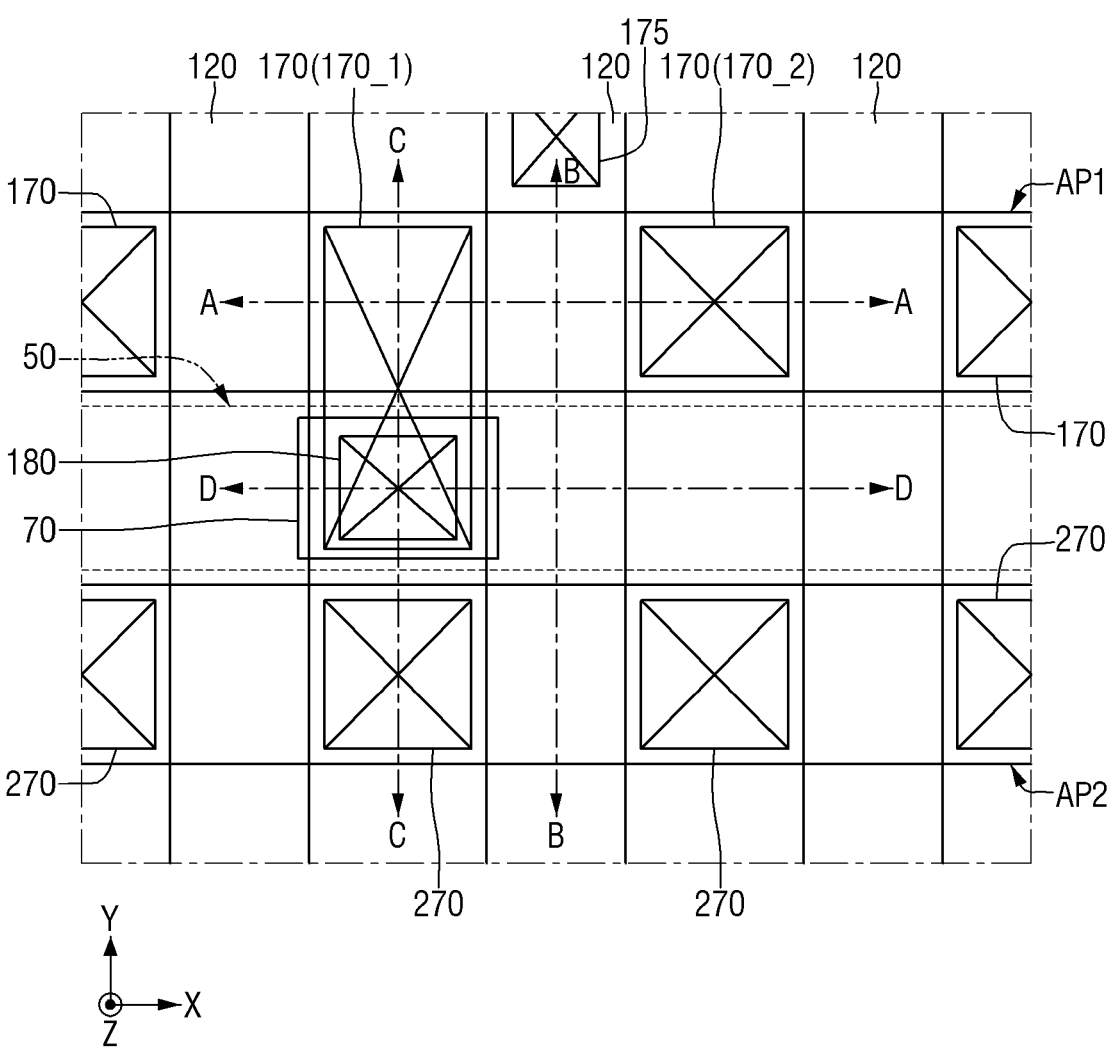
FIGS. 30 to 33 are views for describing a semiconductor device according to some example embodiments.
Figure 31:
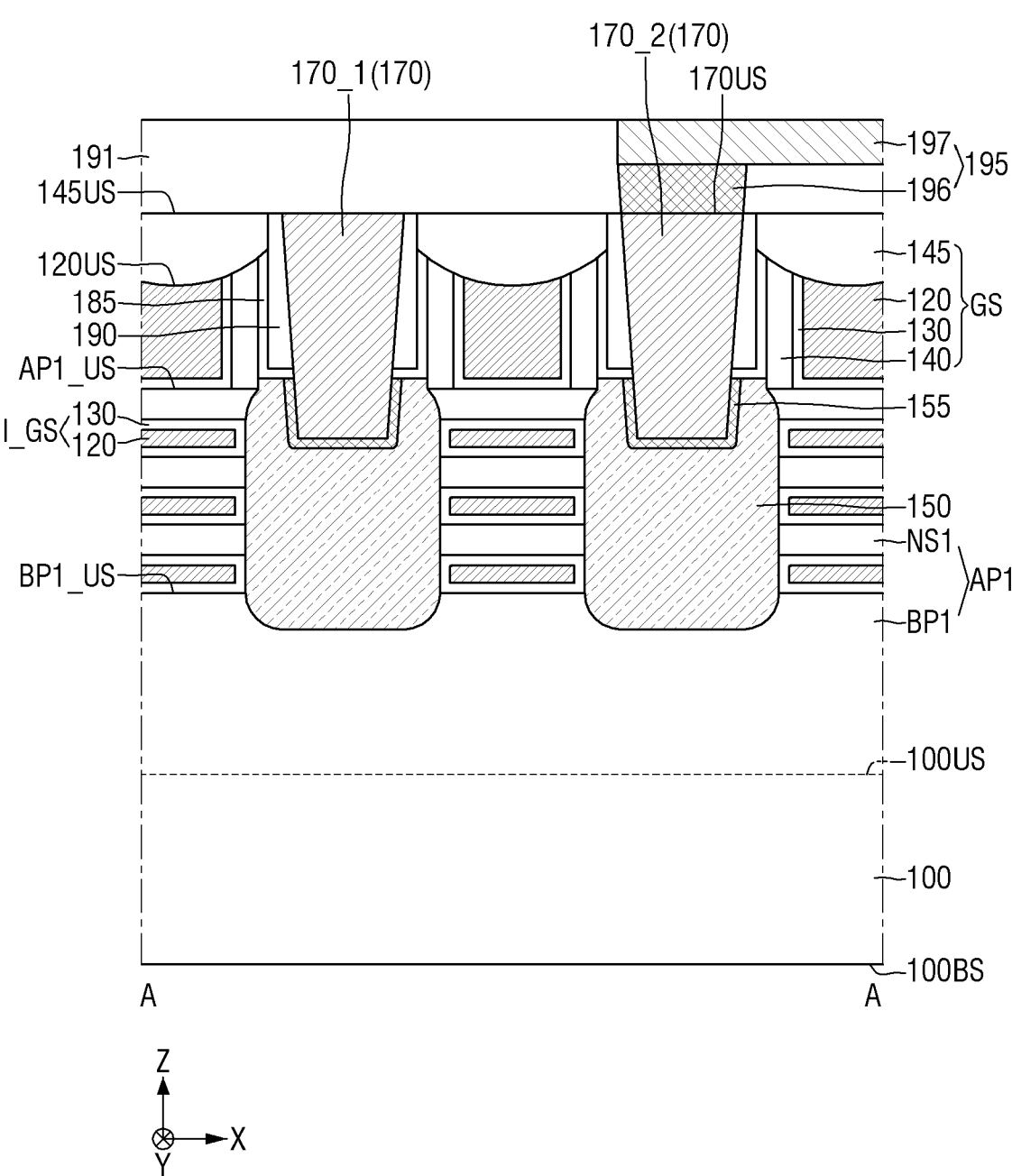
Figure 32:
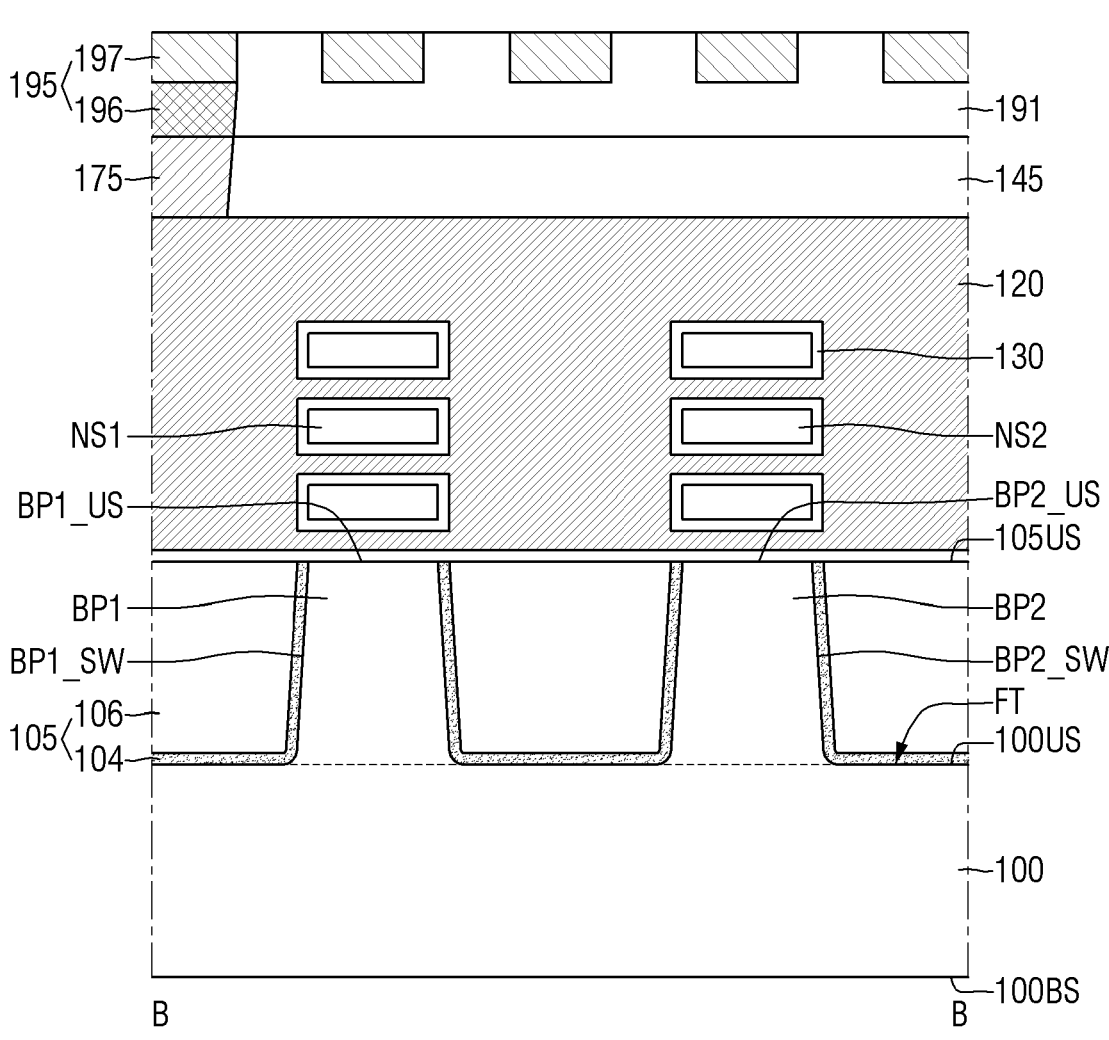
Figure 32:
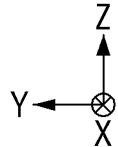
Figure 33:
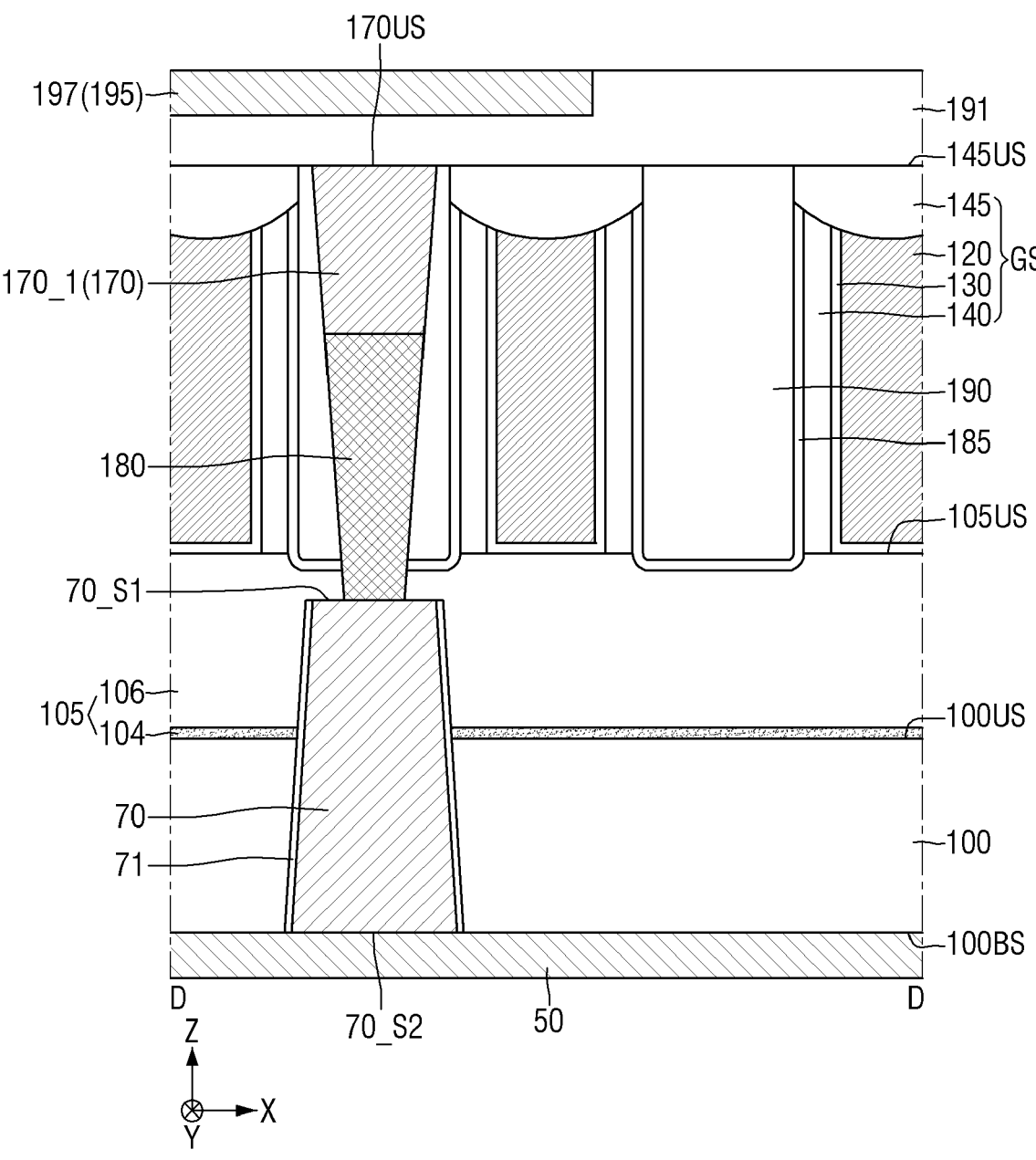

For reference, FIG. 30 is a layout diagram for describing a semiconductor device according to some example embodiments. FIGS. 31 to 33 are cross-sectional views taken along line A-A, line B-B, and line D-D of FIG. 30, respectively. A cross-sectional view taken along line C-C of FIG. 30 may be substantially the same as FIG. 4.

Referring to FIGS. 30 to 33, in a semiconductor device according to some example embodiments, a buried conductive pattern 70 may be formed in a contact shape.

The buried conductive pattern 70 may be disposed between the first lower pattern BP1 and the second lower pattern BP2 adjacent to each other in the second direction Y. The buried conductive pattern 70 may be disposed between the gate electrodes 120 adjacent to each other in the first direction X. When viewed in a plan view, the buried conductive pattern 70 may not cross the gate electrode 120. In FIG. 32, the buried conductive pattern 70 may not be disposed between the first lower pattern BP1 and the second lower pattern BP2 disposed below the gate electrode 120.

The rear wiring line 50 may extend in the first direction X. The present disclosure, however, is not limited thereto.

In concluding the detailed description, those skilled in the art will appreciate that many variations and modifications may be made to the embodiments without substantially departing from the principles of the present inventive concept. Therefore, the disclosed embodiments of the invention are used in a generic and descriptive sense only and not for purposes of limitation.

What is claimed is:
1. A semiconductor device comprising:
a substrate including a first surface and a second surface opposite to each other in a vertical direction that is perpendicular to the first surface;
a fin-shaped pattern provided at the first surface of the substrate and extending in a first horizontal direction that is parallel to the first surface;
a field insulating film disposed on the first surface of the substrate and covering a sidewall of the fin-shaped pattern;
a source/drain pattern disposed on an upper surface of the fin-shaped pattern;
a source/drain etch stop film extending along an upper surface of the field insulating film and a sidewall of the source/drain pattern;
a source/drain contact disposed on the source/drain pattern and connected to the source/drain pattern;
a buried conductive pattern penetrating through the substrate and connected to the source/drain contact, a portion of the buried conductive pattern being disposed within the field insulating film; and
a rear wiring line disposed on the second surface of the substrate and connected to the buried conductive pattern,
wherein the field insulating film includes a first field filling film and a first field stop film, wherein the upper surface of the field insulating film includes an upper surface of the first field filling film, wherein the first field stop film is disposed between the first field filling film and the substrate, wherein the first field stop film includes a material having etch selectivity with respect to the first field filling film, wherein the first field filling film includes silicon oxide, wherein the first field stop film includes an insulating material containing carbon, wherein a concentration of the carbon in the first field stop film at a first height from the first surface of the substrate is different from a concentration of the carbon in the first field stop film at a second height from the first surface of the substrate, and wherein the first height is different from the second height.

2. The semiconductor device of claim 1, further comprising:

a contact connection via disposed between the source/drain contact and the buried conductive pattern, wherein the contact connection via penetrates through the source/drain etch stop film and is connected to the buried conductive pattern.

3. The semiconductor device of claim 1, wherein the buried conductive pattern includes a bottom surface connected to the rear wiring line and an upper surface opposite to the bottom surface of the buried conductive pattern in the vertical direction, and wherein a height from the second surface of the substrate to the upper surface of the buried conductive pattern is smaller than or equal to a height from the second surface of the substrate to a bottom surface of the source/drain pattern.

4. The semiconductor device of claim 1, wherein the field insulating film further includes a second field filling film disposed between the first field stop film and the substrate, and wherein the first field stop film includes a material having etch selectivity with respect to the second field filling film.

5. The semiconductor device of claim 4, wherein the field insulating film further includes a second field stop film disposed between the second field filling film and the substrate, and wherein the second field stop film includes a material having etch selectivity with respect to the second field filling film.

6. The semiconductor device of claim 5 wherein the field insulating film further includes a third field filling film disposed between the second field stop film and the substrate, and wherein the second field stop film includes a material having etch selectivity with respect to the third field filling film.

7. The semiconductor device of claim 1, wherein the first field stop film includes a lower field stop film and an upper field stop film extending along the first surface of the substrate, and wherein the upper field stop film contacts the lower field stop film.

8. The semiconductor device of claim 1, wherein a width of the buried conductive pattern in a second horizontal direction decreases as a distance from the second surface of the substrate increases, and wherein the second horizontal direction is parallel to the first surface of the substrate and different from the first horizontal direction.

9. The semiconductor device of claim 1, wherein the substrate includes a semiconductor material.

10. The semiconductor device of claim 1, wherein the substrate is made of an insulating material.

11. The semiconductor device of claim 10, further comprising:

a sheet active pattern disposed on the fin-shaped pattern, wherein the source/drain pattern contacts the sheet active pattern.

12. A semiconductor device comprising:

a substrate including a first surface and a second surface opposite to each other in a vertical direction that is perpendicular to the first surface;

a fin-shaped pattern provided at the first surface of the substrate and extending in a first horizontal direction that is parallel to the first surface;

a gate electrode disposed on the fin-shaped pattern and extending in a second horizontal direction that is parallel to the first surface and different from the first horizontal direction;

a field insulating film disposed on the substrate and covering a sidewall of the fin-shaped pattern;

a source/drain pattern disposed on the fin-shaped pattern;

a source/drain contact disposed on the source/drain pattern and connected to the source/drain pattern;

a buried conductive pattern penetrating through the substrate, a height of the buried conductive pattern in the vertical direction being greater than a thickness of the substrate;

a contact connection via disposed between the source/drain contact and the buried conductive pattern; and a rear wiring line disposed on the second surface of the substrate and connected to the buried conductive pattern, wherein the field insulating film includes a first field filling film and a first field stop film, wherein an upper surface of the field insulating film includes an upper surface of the first field filling film, wherein the first field stop film is disposed between the first field filling film and the substrate, wherein the first field stop film includes a material having etch selectivity with respect to the first field filling film, wherein the buried conductive pattern includes a bottom surface connected to the rear wiring line and an upper surface opposite to the bottom surface of the buried conductive pattern in the vertical direction, wherein a width of the bottom surface of the buried conductive pattern in the second horizontal direction is greater than a width of the upper surface of the buried conductive pattern in the second horizontal direction, wherein the second horizontal direction is parallel to the first surface of the substrate and different from the first horizontal direction, wherein the first field filling film includes silicon oxide, wherein the first field stop film includes an insulating material containing carbon, wherein a concentration of the carbon in the first field stop film at a first height from the first surface of the substrate is different from a concentration of the carbon in the first field stop film at a second height from the first surface of the substrate, and wherein the first height is different from the second height.

13. The semiconductor device of claim 12, wherein a height from the second surface of the substrate to the upper surface of the buried conductive pattern is smaller than a height from the second surface of the substrate to a bottom surface of the source/drain pattern.

14. The semiconductor device of claim 12, further comprising:

a source/drain etch stop film extending along the upper surface of the field insulating film and a sidewall of the source/drain pattern, wherein the contact connection via penetrates through the source/drain etch stop film and contacts the buried conductive pattern.

15. The semiconductor device of claim 12, wherein the field insulating film further includes a second field filling film disposed between the first field stop film and the substrate, and wherein the first field stop film includes a material having etch selectivity with respect to the second field filling film.

16. The semiconductor device of claim 15, wherein the field insulating film further includes a second field stop film disposed between the second field filling film and the substrate, and wherein the second field stop film includes a material having etch selectivity with respect to the second field filling film.

17. A semiconductor device comprising:

a substrate including a first surface and a second surface opposite to each other in a vertical direction that is perpendicular to the first surface;

a fin-shaped pattern provided at the first surface of the substrate and extending in a first horizontal direction that is parallel to the first surface;

a sheet pattern disposed on the fin-shaped pattern and spaced apart from the fin-shaped pattern in the vertical direction;

a gate electrode disposed on the fin-shaped pattern and extending in a second horizontal direction that is parallel to the first surface and different from the first horizontal direction;

a field insulating film disposed on the substrate surrounding the fin-shaped pattern;

a source/drain pattern disposed on the fin-shaped pattern and connected to the sheet pattern;

a source/drain etch stop film extending along an upper surface of the field insulating film and a sidewall of the source/drain pattern;

a source/drain contact disposed on the source/drain pattern and connected to the source/drain pattern;

a rear wiring line disposed on the second surface of the substrate;

a buried conductive pattern connected to the rear wiring line and penetrating through the substrate; and a contact connection via connecting the source/drain contact to the buried conductive pattern, wherein the field insulating film includes a first field filling film and a field stop film, wherein the upper surface of the field insulating film includes an upper surface of the first field filling film, wherein the field stop film is disposed between the first field filling film and the substrate, wherein the field stop film includes a material having etch selectivity with respect to the first field filling film, wherein the buried conductive pattern includes a bottom surface connected to the rear wiring line and an upper surface opposite to the bottom surface of the buried conductive pattern in the vertical direction, wherein the upper surface of the buried conductive pattern is higher than the first surface of the substrate and lower than a bottom surface of the source/drain pattern relative to the second surface of the substrate, wherein the first field filling film includes silicon oxide, wherein the field stop film includes an insulating material containing carbon, wherein a concentration of the carbon in the field stop film at a first height from the first surface of the substrate is different from a concentration of the carbon in the field stop film at a second height from the first surface of the substrate, and wherein the first height is different from the second height.

18. The semiconductor device of claim 17, wherein the field insulating film further includes a second field filling film disposed between the field stop film and the substrate, and wherein the field stop film includes a material having etch selectivity with respect to the second field filling film.

* * * * *